(12) United States Patent
Takojima et al.

(10) Patent No.: US 10,879,442 B2
(45) Date of Patent: Dec. 29, 2020

(54) FLEXIBLE AND LIGHT-TRANSMISSIBLE LIGHT-EMITTING DEVICE AND METHOD FOR MANUFACTURING LIGHT-EMITTING DEVICE

(71) Applicant: TOSHIBA HOKUTO ELECTRONICS CORPORATION, Asahikawa (JP)

(72) Inventors: Naoki Takojima, Hokkaido (JP); Yojiro Yarimizu, Hokkaido (JP); Tsuyoshi Abe, Hokkaido (JP); Kouji Tanaka, Hokkaido (JP)

(73) Assignee: Toshiba Hokuto Electronics Corporation, Asahikawa (JP)

( * ) Notice: Subject to any disclaimer, the term of this patent is extended or adjusted under 35 U.S.C. 154(b) by 31 days.

(21) Appl. No.: 16/281,369

(22) Filed: Feb. 21, 2019

(65) Prior Publication Data

US 2020/0075824 A1    Mar. 5, 2020

(30) Foreign Application Priority Data

Aug. 30, 2018   (JP) ................................. 2018-161656

(51) Int. Cl.
*H01L 33/62*    (2010.01)
*F21V 23/06*    (2006.01)
*G09F 9/33*     (2006.01)
*F21Y 115/10*   (2016.01)

(52) U.S. Cl.
CPC .............. *H01L 33/62* (2013.01); *F21V 23/06* (2013.01); *G09F 9/33* (2013.01); *F21Y 2115/10* (2016.08); *H01L 2933/0066* (2013.01)

(58) Field of Classification Search
CPC ........................ H01L 33/62; H01L 2933/0066
See application file for complete search history.

(56) References Cited

U.S. PATENT DOCUMENTS

2016/0276561 A1*   9/2016   Maki ....................... H01L 24/81

FOREIGN PATENT DOCUMENTS

JP         2012-084855 A1    4/2012

* cited by examiner

*Primary Examiner* — Daniel P Shook
(74) *Attorney, Agent, or Firm* — Burr & Brown, PLLC

(57) ABSTRACT

A light-emitting device according to embodiments of the invention includes a film having light transmissive property to visible light; a conductor layer formed on one surface of the film; and a light-emitting element having electrodes connected to the conductor layer via bumps protruding toward the film. The curvature of the film curved on the outer edge of a contact area of the conductor layer contacting the bumps is defined by a radius of a circle contacting the conductor layer at at least three points on the outer edge of the contact area, and the radius of this circle is 13 μm or larger.

8 Claims, 17 Drawing Sheets

FLEXIBLE AND LIGHT-TRANSMISSIBLE LIGHT-EMITTING DEVICE AND METHOD FOR MANUFACTURING LIGHT-EMITTING DEVICE

CROSS-REFERENCE TO RELATED APPLICATIONS

This application is based upon and claims the benefit of priority from the prior Japanese Patent Application No. 2018-161656, filed on Aug. 30, 2018, the entire contents of which are incorporated herein by reference.

BACKGROUND OF THE INVENTION

1. Field of the Invention

Embodiments of the present invention relate to a light-emitting device and a method for manufacturing a light-emitting device.

2. Description of Related Art

Light-emitting devices that use light-emitting elements are widely utilized in display devices for indoor use, outdoor use, stationary use, mobile use, and the like; and optical devices such as display lamps, various switches, signaling devices, and general illuminations. In this kind of light-emitting devices, light-emitting diodes (LED's) are generally used as the light-emitting elements. Among the light-emitting devices that use light-emitting diodes, a light-emitting device including two sheets of a film having light transmissive property; and a plurality of light-emitting diodes disposed between these films, is known as a device suitable for a display device, a display lamp, and the like, which display various character strings, geometric figures, patterns, and the like (JP 2012-084855 A). Each of a plurality of the light-emitting diodes has a pair of electrodes. Each electrode is electrically connected to a conductor layer provided in each film via bumps (US 2016/0276561 A).

SUMMARY OF THE INVENTION

When the above-described light-emitting device is produced, for example, the electrodes of the light-emitting diodes are electrically connected to the conductor layer via bumps by subjecting a pair of films having the light-emitting diodes disposed therebetween to thermocompression bonding. However, when a pair of films is subjected to thermocompression bonding, the films and the conductor layers formed in the films are deformed along the bumps of the light-emitting diodes. At this time, since the films undergo elastic deformation, while the conductor layers undergo plastic deformation, at the sites where the films have been deformed, the films and the conductor layers may be partially detached with a lapse of time.

In view of such circumstances, it is an object of the embodiments of the invention to enhance the reliability of a light-emitting device.

In order to solve the problems described above, a light-emitting device according to an embodiment includes a film having light transmissive property to visible light; a conductor layer formed on one surface of the film; and a light-emitting element having electrodes connected to the conductor layer via bumps protruding toward the film. The curvature of the film depressed at the outer edge of a contact area of the conductor layer contacting the bumps is defined by a radius of a circle contacting the conductor layer at at least three points on the outer edge of the contact area, and the radius of this circle is 13 μm or larger.

DETAILED DESCRIPTION OF THE INVENTION

In the following description, embodiments of the invention will be explained using the attached drawings. In the explanation, an XYZ coordinate system formed from an X-axis, a Y-axis, and a Z-axis, which orthogonally intersect with one another, is used.

Figure 1:
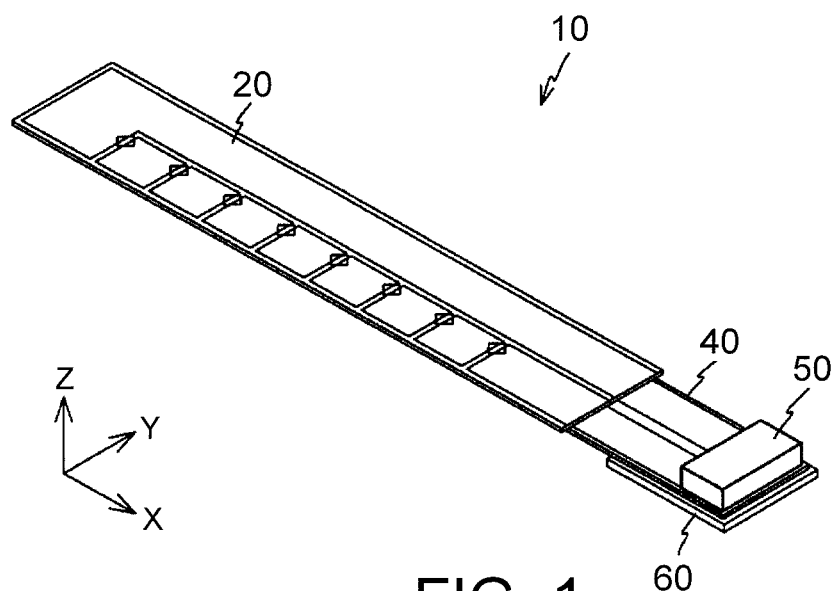
FIG. 1 is a perspective view of a light-emitting module according to an embodiment.
Figure 2:
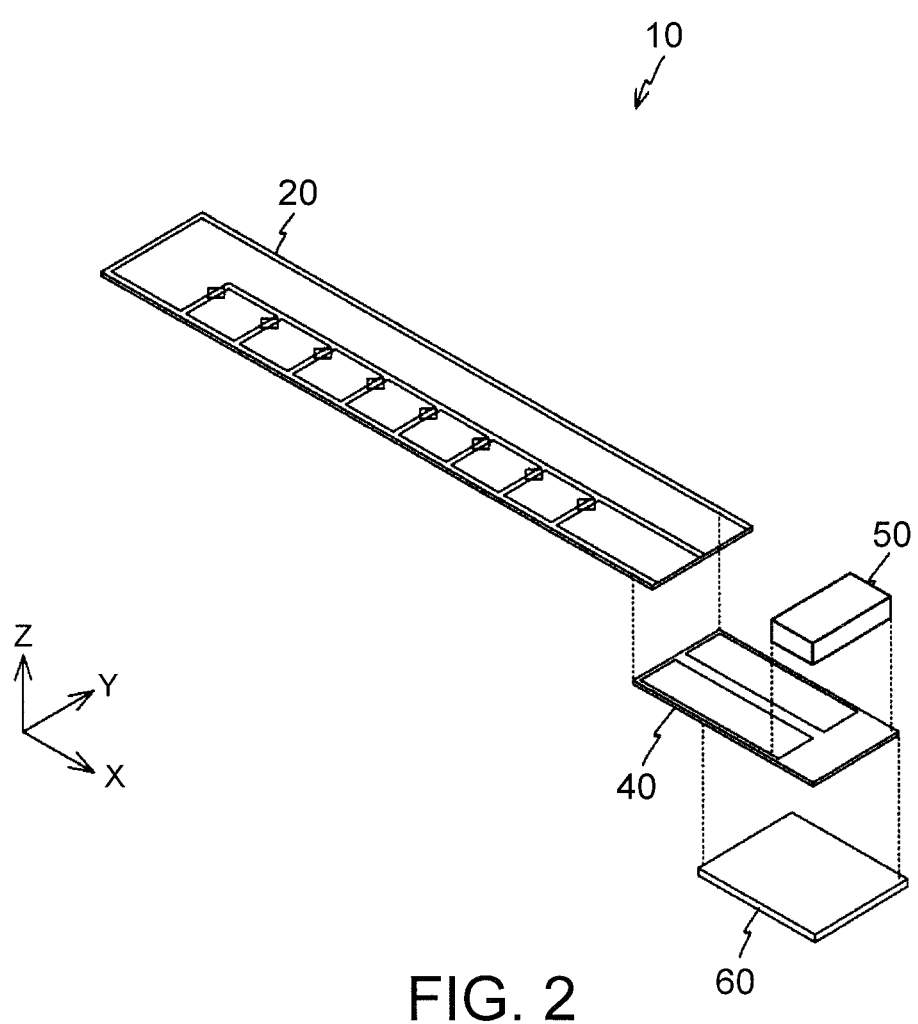
FIG. 2 is an exploded perspective view of the light-emitting module.

FIG. 1 is a perspective view of a light-emitting module 10 according to the present embodiment. FIG. 2 is an exploded perspective view of the light-emitting module 10. As can be seen by referring to FIG. 1 and FIG. 2, the light-emitting module 10 has a rectangular-shaped light-emitting panel 20 having its longitudinal direction along the X-axis direction; a flexible cable 40 that is connected to the light-emitting panel 20; a connector 50 that is mounted in the flexible cable 40; and a reinforcing plate 60 that is fixed to the flexible cable 40.

Figure 3:
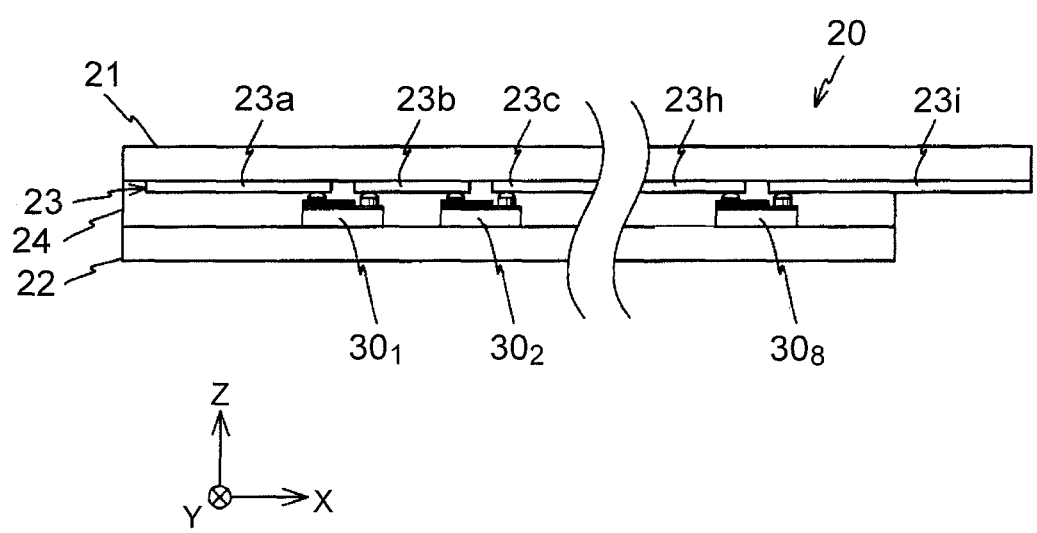
FIG. 3 is a side view of a light-emitting panel.

FIG. 3 is a side view of the light-emitting panel 20 that constitutes the light-emitting module 10. As shown in FIG. 3, the light-emitting panel 20 has a pair of films 21 and 22; a resin layer 24 formed between the films 21 and 22; and eight light-emitting elements $30_1$ to $30_8$ disposed inside the resin layer 24.

Films 21 and 22 are rectangular-shaped film having their longitudinal directions along the X-axis direction. Film 21 has light transmissive property to visible light, and the total light transmittance is about 5% to 95%. Meanwhile, the total light transmittance refers to the total light transmittance measured according to the Japanese Industrial Standard JIS K7375:2008.

The thickness of the films 21 and 22 is preferably in the range of 50 μm to 300 μm. When the films 21 and 22 are too thick, it is difficult to impart satisfactory bendability to the films 21 and 22, and there is a risk that the light transmission properties may deteriorate.

Furthermore, the films 21 and 22 have flexibility, and the flexural modulus is about 0 to 320 kgf/mm$^2$ (excluding zero). The flexural modulus is a value measured by the method according to ISO 178 (JIS K7171:2008).

Regarding the material for the films 21 and 22, polyethylene terephthalate (PET), polyethylene naphthalate (PEN), a polycarbonate (PC), polyethylene succinate (PES), a cyclic olefin resin (for example, ARTON (trade name) manufactured by JSR Corporation), an acrylic resin, and the like may be considered. The materials for the films 21 and 22 may be identical, or the material for the film 21 and the material for the film 22 may be different from each other.

On the lower surface of the film 21, a mesh-shaped conductor layer 23 is formed. The conductor layer 23 is formed from a metal material such as copper (Cu), silver (Ag), gold (Au), or platinum (Pt). The thickness of the conductor layer 23 is desirably about 0.05 μm to 2 μm, or about 0.05 μm to 20 μm.

Figure 4:
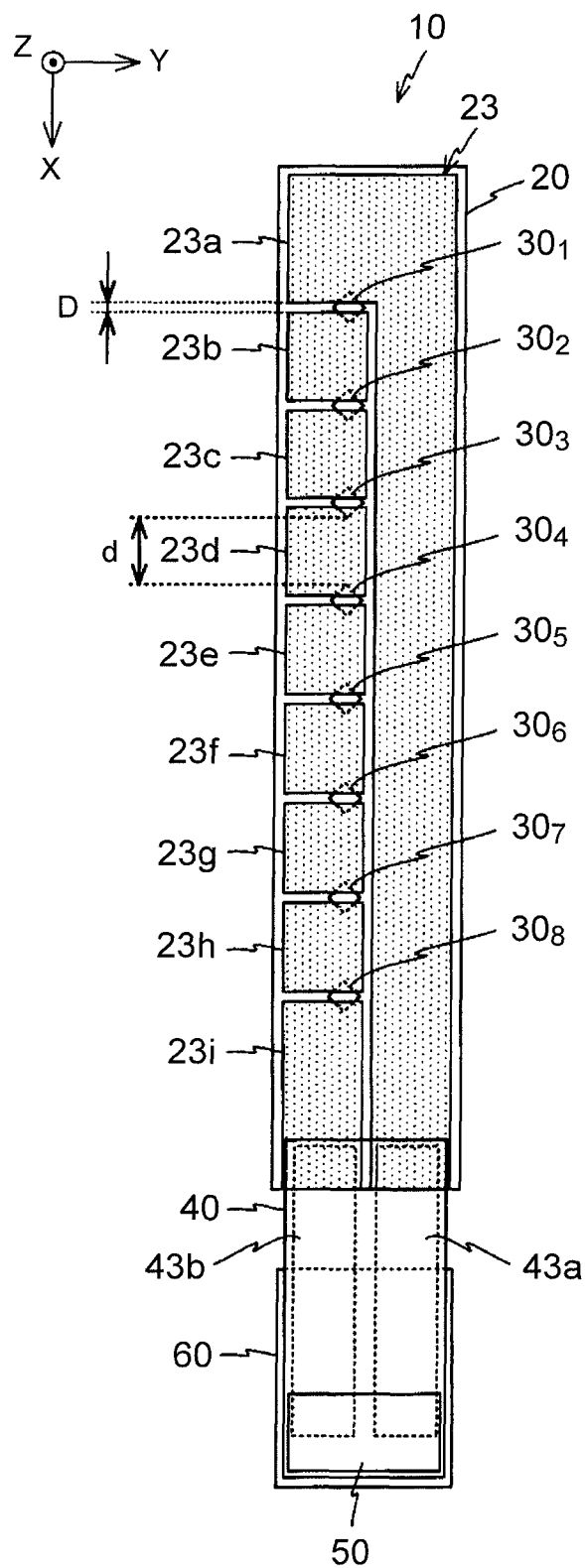
FIG. 4 is a plan view of the light-emitting module.

FIG. 4 is a plan view of the light-emitting module 10. As can be seen by referring to FIG. 3 and FIG. 4, the conductor layer 23 is formed from an L-shaped mesh pattern 23a formed along the outer edge on the +Y side of the film 21, and rectangular-shaped mesh patterns 23b to 23i arrayed along the outer edge on the −Y side of the film 21. In the light-emitting panel 20 of the light-emitting module 10, the distance D between two adjacent mesh patterns of the mesh patterns 23a to 23i is about 100 μm or less.

As can be seen by referring to FIG. 3, in the light-emitting panel 20, the film 22 has a shorter length in the X-axis direction compared to the film 21. Therefore, the +X side ends of the mesh pattern 23a and mesh pattern 23i that constitute the conductor layer 23 are in an exposed state.

The details of the materials and configurations of the conductor layer and the mesh patterns are specifically disclosed in WO 2015/083366 A. The content disclosed in WO 2015/083366 A (U.S. Ser. No. 15/078,404) has been partially incorporated in the present specification, and a detailed description on the conductor layer and the mesh patterns will not be repeated here.

Between the films 21 and 22, a resin layer 24 having light transmissive property to visible light is formed, except for the areas where the light-emitting elements $30_1$ to $30_8$ are disposed. The resin layer 24 is formed from, for example, an epoxy-based resin as a thermosetting resin. The thermosetting resin that constitutes the resin layer 24 is preferably such that, for example, the lowest melt viscosity before curing, VC1, is in the range of 10 to 10,000 Pa·s at a temperature in the range of 80° C. to 160° C. Furthermore, it is preferable that the melt viscosity change ratio VR obtainable until the temperature T1 (maximum softening temperature) is reached at the lowest melt viscosity before curing, VC1, is 1/1,000 or lower (less than or equal to one-thousandth). Furthermore, in regard to the resin layer 24, it is preferable that the Vicat softening temperature T2 after the resin layer reaches the lowest melt viscosity by being heated, that is, after the resin layer has been cured, is in the range of 80° C. to 160° C., and the tensile storage modulus EM at a temperature in the range of 0° C. to 100° C. is in the range of 0.01 to 1,000 GPa. Furthermore, it is preferable that the resin layer 24 has a glass transition temperature T3 of 100° C. to 160° C.

Preferred physical property values of the thermosetting resin are, for example, as follows.

Lowest melt viscosity VC1: 10 to 10,000 Pa·s;

Temperature T1 at the lowest melt viscosity VC1 (maximum softening temperature): 80° C. to 160° C.;

Melt viscosity change ratio VR until the temperature T1 is reached: 1/1,000 or lower;

Vicat softening temperature T2: 80° C. to 160° C.;

Tensile storage modulus EM: 0.01 to 1,000 GPa between 0° C. and 100° C.; and

Glass transition temperature T3: 100° C. to 160° C.

Known examples of a resin having thermosetting properties include an epoxy-based resin, an acrylic resin, a styrene-based resin, an ester-based resin, a urethane-based resin, a melamine resin, a phenolic resin, an unsaturated polyester resin, and a diallyl phthalate resin. Among these, an epoxy-based resin is excellent in light transmissibility, electrical insulation properties, flexibility, as well as fluidity at the time of softening, adhesiveness after curing, weather resistance, and the like, and therefore, an epoxy-based resin is suitable as a constituent material for the resin layer 24. Of course, the resin layer 24 may be formed from any resin other than an epoxy-based resin. It is preferable that the resin layer 24 is formed from a material containing a resin having thermosetting properties as a main component; however, the resin layer 24 may also include other components as necessary. The thickness of the resin layer 24 may be equal to the gap between the films 21, 22, but is preferably smaller than the height of the light-emitting elements 30 in order to increase the contact property between the conductive layers 23 and the electrodes 35, 36. Further, a thickness (T) of the resin layer 24 is preferably set so that a difference (H−T) from a height (H) of the light-emitting elements 30 falls within a range of 5 to 200 μm. However, if the thickness (T) of the resin layer 24 is made too small, maintenance of the shape of the resin layer 24 may become difficult or the adhesiveness to the light-emitting elements 30 or the like may decrease. Therefore, the difference (H−T) between the height (H) of the light-emitting elements 30 and the thickness (T) of the resin layer 24 is preferably set to ½ or less of the height (H) of the light-emitting elements 30.

The details of the material or configuration of the conductor layer formed from a thermosetting resin are specifically disclosed in WO 2016/047134 A. The content disclosed in WO 2016/047134 A (U.S. Ser. No. 15/465,899) has been partially incorporated in the present specification, and a detailed explanation on the conductor layer formed from a thermosetting resin will not be repeated here.

Figure 5:
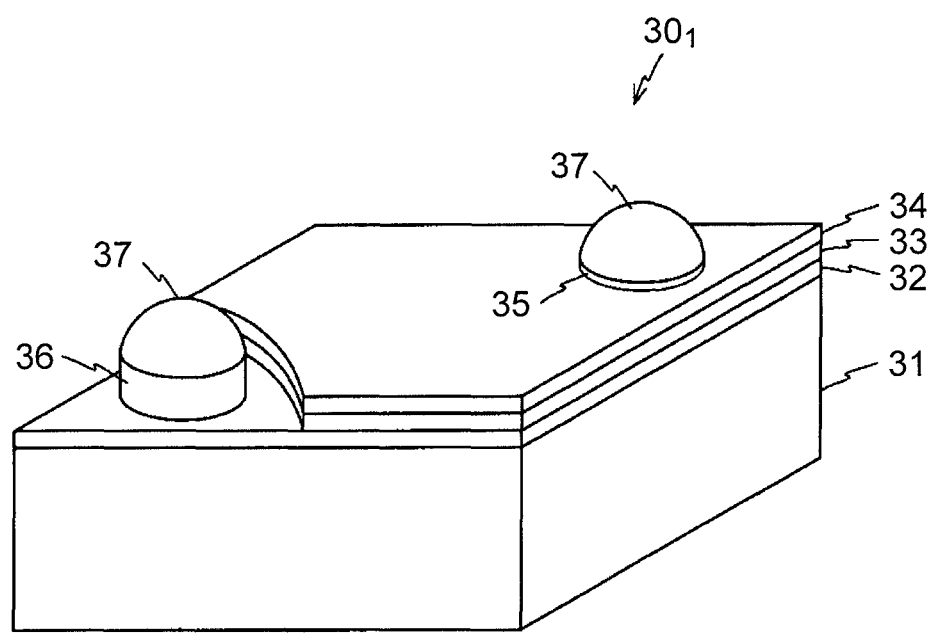
FIG. 5 is a perspective view of a light-emitting element.
Figure 5:
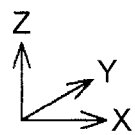

The light-emitting element $30_1$ is a square-shaped light-emitting diode chip that measures 0.3 mm to 3 mm on each side. As illustrated in FIG. 5, the light-emitting element $30_1$ is a light-emitting diode having a four-layer structure composed of a base substrate 31, an N-type semiconductor layer 32, an active layer 33, and a P-type semiconductor layer 34. The rated voltage of the light-emitting element $30_1$ is about 2.5 V.

The base substrate 31 is a sapphire substrate or a semiconductor substrate. On the upper surface of the base substrate 31, an N-type semiconductor layer 32 having the same shape as that of the base substrate 31 is formed. Then, on the upper surface of the N-type semiconductor layer 32, an active layer 33 and a P-type semiconductor layer 34 are laminated in this order. At the corner parts on the −Y side and the −X side of the active layer 33 and the P-type semiconductor layer 34 laminated on the N-type semiconductor layer 32, notches are formed, and the surface of the N-type semiconductor layer 32 is exposed through these notches. When a material having light transmissive property is used as the base substrate 31, light is radiated through both the upper and lower surfaces of the light-emitting element.

At the part exposed through the active layer 33 and the P-type semiconductor layer 34 in the N-type semiconductor layer 32, an electrode 36 that is electrically connected to the N-type semiconductor layer 32 is formed. Furthermore, at the corner part on the +X side and the +Y side of the P-type semiconductor layer 34, an electrode 35 that is electrically connected to the P-type semiconductor layer 34 is formed. The electrodes 35 and 36 are formed from copper (Cu) or gold (Au), and bumps 37 are formed on the upper surface. The bumps 37 are formed from gold (Au), an AuSn alloy, silver (Ag), an alloy of copper (Cu) and nickel (Ni) or another metal, or the like. In the light-emitting element $30_1$, the bump 37 of the electrode 36 functions as a cathode electrode, while the bump 37 of the electrode 35 functions as an anode electrode.

The melting point of the bump 37 is preferably 180° C. or higher, and more preferably 200° C. or higher. The upper limit is 1,100° C. or lower as a practically useful range.

The dynamic hardness value DHV of the bump 37 is from 3 to 150, preferably from 5 to 100, and more preferably from 5 to 50.

The height of the bump 37 is preferably from 5 µm to 80 µm, and more preferably from 10 µm to 60 µm.

The contact area between the electrodes 35 and 36 and the bumps 37 in the light-emitting element $30_1$ is preferably from 100 µm² to 15,000 µm². Furthermore, the contact area is more preferably from 400 µm² to 8,000 µm².

The details of the material or configuration of the bump provided on the electrode of the light-emitting element are disclosed in WO 2015/083365 A. The content disclosed in WO 2015/083365A (U.S. Ser. No. 15/078,321) has been partially incorporated in the present specification, and a detailed explanation on the bump provided on the electrode of the light-emitting element will not be repeated here.

Figure 6:
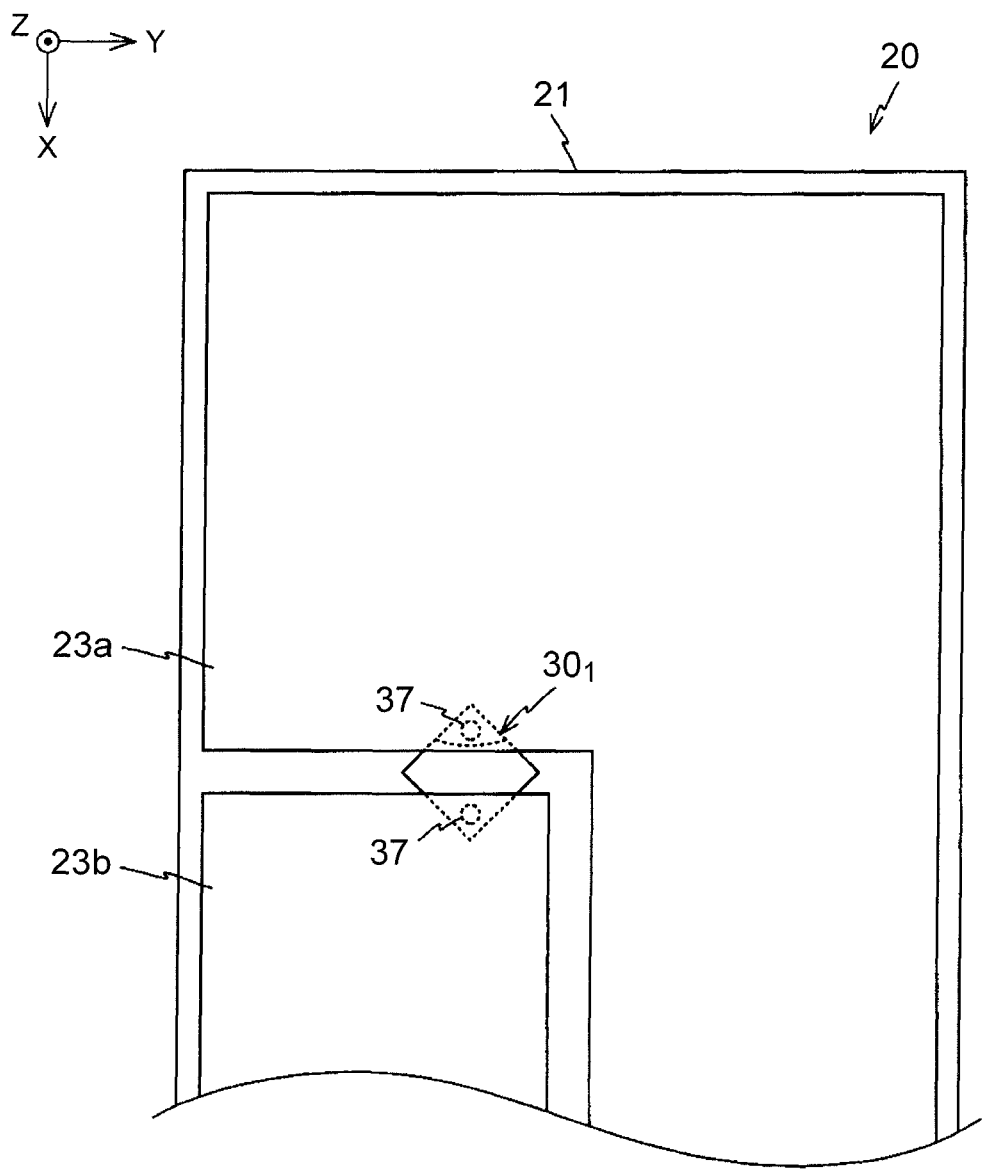
FIG. 6 is a diagram illustrating a magnified view of a mesh pattern.

The light-emitting element $30_1$ configured as explained above is disposed between the mesh patterns 23a and 23b as illustrated in FIG. 6, and one of the bumps 37 is connected to the mesh pattern 23a, while the other bump 37 is connected to the mesh pattern 23b.

Figure 7:
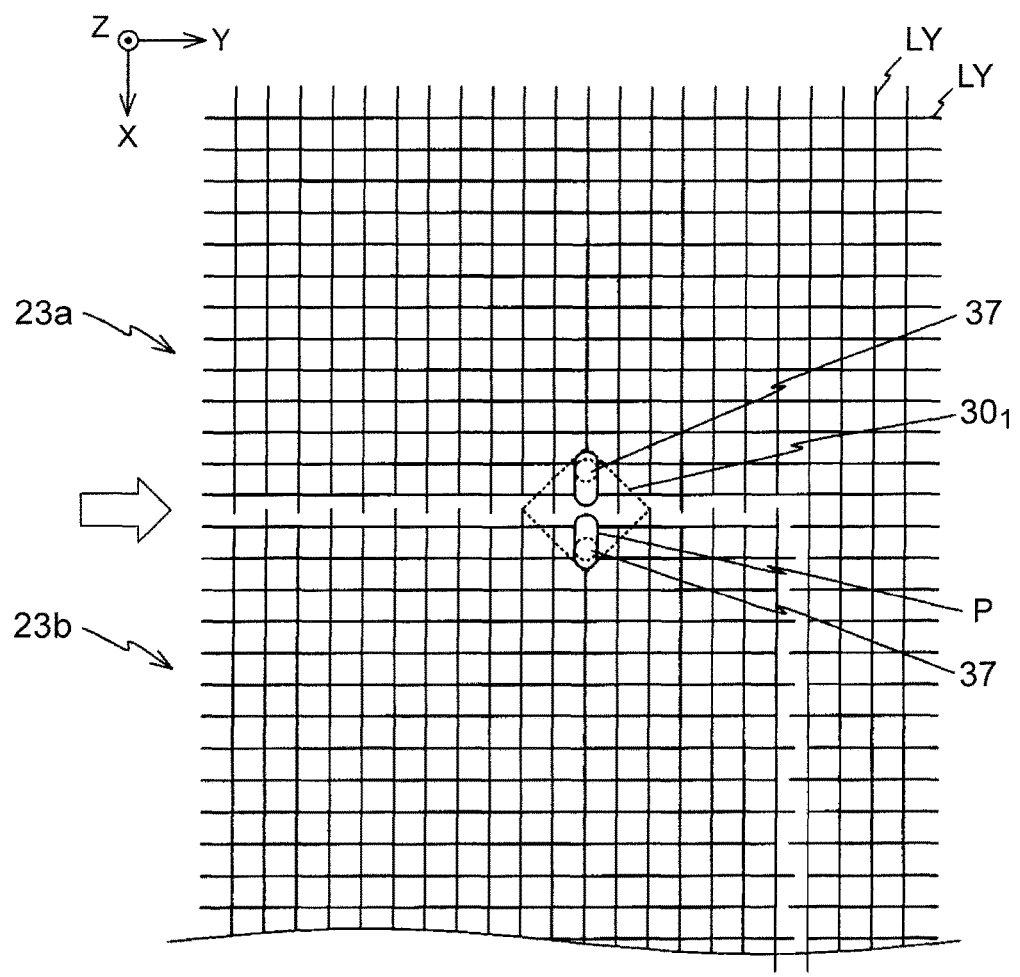
FIG. 7 is a diagram illustrating the light-emitting element connected to the mesh pattern.

FIG. 7 is a diagram showing a magnified view of the mesh patterns 23a and 23b. As can be seen by referring to FIG. 7, the mesh patterns 23a and 23b are formed by a plurality of line patterns LX that are parallel to the X-axis, and a plurality of line patterns LY that are parallel to the Y-axis. Each of the mesh patterns 23a to 23i is provided with connection pads P, to which the bumps 37 of the light-emitting element $30_1$ are connected. The line width of each of the line patterns LX and LY is about 10 µm, and the line patterns are formed at a pitch of about 300 µm.

As illustrated in FIG. 7, the light-emitting element $30_1$ is disposed over the mesh patterns 23a and 23b so as to transverse the boundaries. Then, one of the bumps 37 is connected to the connection pad P provided on the mesh pattern 23a, and the other bump 37 is connected to the connection pad P provided on the mesh pattern 23b.

Mesh patterns 23c to 23i are also formed similarly to the mesh patterns 23a and 23b illustrated in FIG. 7. Furthermore, other light-emitting elements $30_2$ to $30_8$ also have a configuration similar to that of the light-emitting element $30_1$. As illustrated in FIG. 4, the light-emitting element $30_2$ is disposed between the mesh patterns 23b and 23c, and a pair of bumps 37 are respectively connected to the mesh patterns 23b and 23c. Hereinafter, similarly, the light-emitting element $30_3$ is disposed over the mesh patterns 23c and 23d. The light-emitting element $30_4$ is disposed over the mesh patterns 23d and 23e. The light-emitting element $30_5$ is disposed over the mesh patterns 23e and 23f. The light-emitting element $30_6$ is disposed over the mesh patterns 23f and 23g. The light-emitting element $30_7$ is disposed over the mesh patterns 23g and 23h. The light-emitting element $30_8$ is disposed over the mesh patterns 23h and 23i. Thereby, the mesh patterns 23a to 23i and the light-emitting elements $30_1$ to $30_8$ are connected in series. In the light-emitting panel 20 of the light-emitting module 10, the interval of disposition d of the light-emitting element 30 is about 10 mm.

Figure 8:
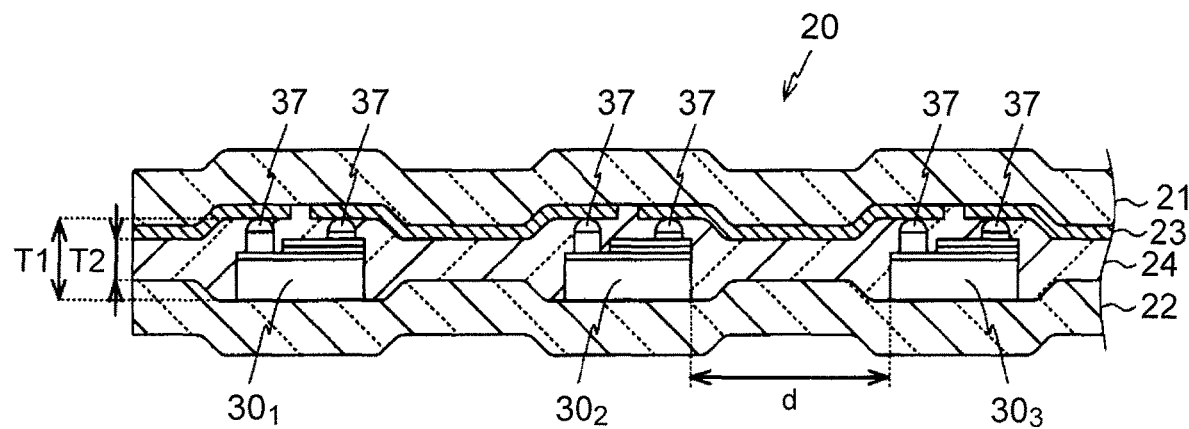
FIG. 8 is a side view illustrating a magnified view of the vicinity of the light-emitting element that constitutes the light-emitting panel.

FIG. 8 is a side view illustrating a magnified view of the vicinity of the light-emitting elements $30_1$ to $30_3$ that constitute the light-emitting panel 20. The thickness of most parts of the resin layer 24 of the light-emitting panel 20 that is configured as explained above is T2, and the thickness of the parts where the light-emitting elements $30_1$ to $30_8$ are positioned is T1. The value of T1 is the magnitude combining the height of the light-emitting elements $30_1$ to $30_8$ and the height of the bump 37, and this value is larger than the value of T2. As shown in FIG. 8, the films 21 and 22 of the light-emitting panel 20 have a curved shape such that the sites where the light-emitting elements $30_1$ to $30_8$ are positioned protrude outward, and the circumferences of the light-emitting elements $30_1$ to $30_8$ are depressed inward. As such, since the films 21 and 22 are curved, the conductor layer 23 is in a state of being pressed toward the bumps 37 by the films 21 and 22. Therefore, electrical connection performance between the conductor layer 23 and the bumps 37 or reliability of the electrical connection can be increased.

Figure 9:
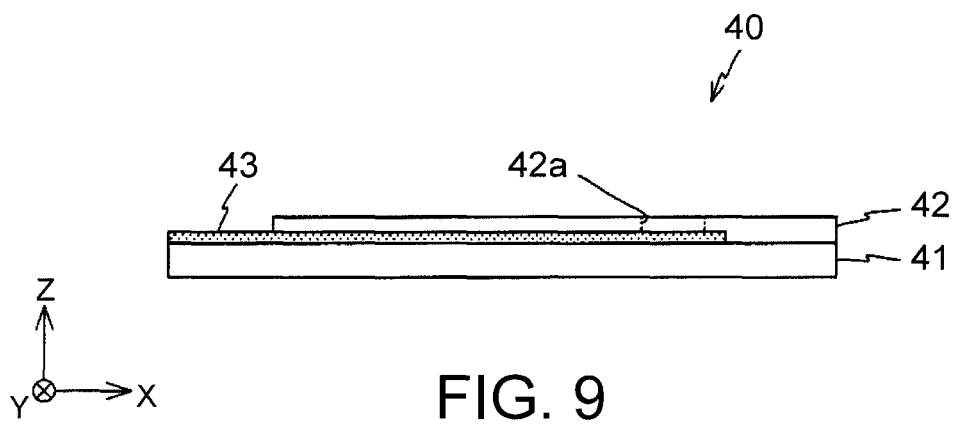
FIG. 9 is a side view of a flexible cable.

FIG. 9 is a side view of a flexible cable 40. As shown in FIG. 9, the flexible cable 40 is configured to include abase material, 41, a conductor layer 43, and a cover lay 42.

The base material 41 is a rectangular-shaped member having its longitudinal direction along the X-axis direction. This base material 41 is formed from, for example, a polyimide and a conductor layer 43 is formed on the upper surface of the base material. The conductor layer 43 is formed by patterning a copper foil attached on the upper surface of the polyimide. In the present embodiment, the conductor layer 43 is formed from two conductor patterns 43a and 43b, as shown in FIG. 4.

As shown in FIG. 9, the conductor layer 43 formed on the upper surface of the base material 41 is covered by a cover lay 42 that has been subjected to vacuum thermocompression bonding. This cover lay 42 has a shorter length in the X-axis direction than that of the base material 41. Therefore, the −X side edges of the conductor patterns 43a and 43b (see FIG. 4) that constitute the conductor layer 43 are in an exposed state. Furthermore, the cover lay 42 is provided with an opening 42a, and at this opening 42a, the +X side edges of the conductor patterns 43a and 43b of the conductor layer 43 are exposed.

Figure 10:
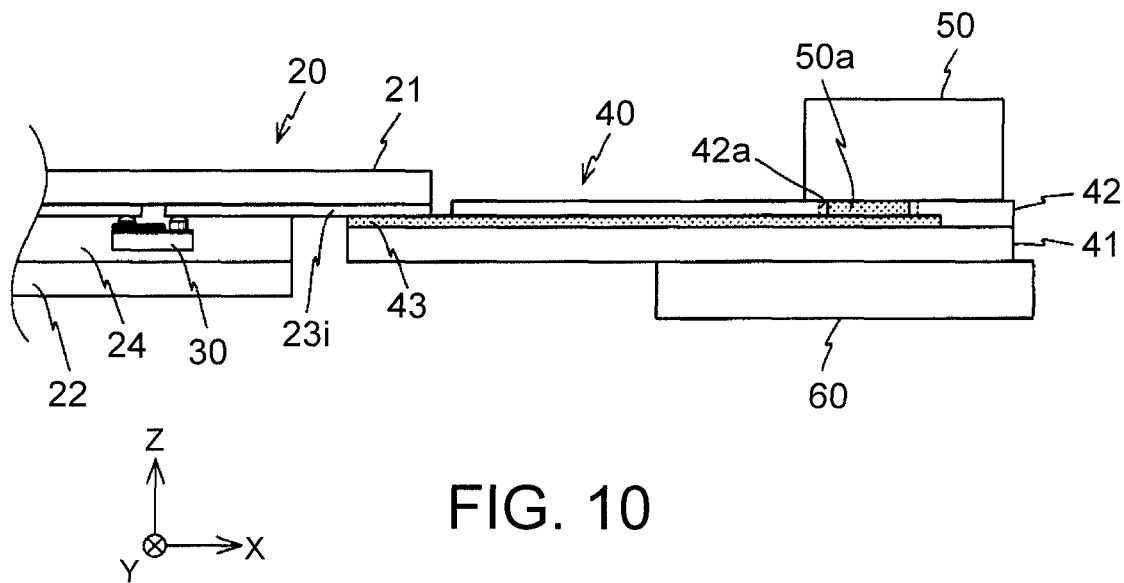
FIG. 10 is a diagram for explaining the procedure for connecting the light-emitting panel to the flexible cable.

As can be seen by referring to FIG. 4 and FIG. 10, the flexible cable 40 configured as explained above is such that the conductor patterns 43a and 43b exposed from the cover lay 42 are adhered to the light-emitting panel 20 in a state of being brought into contact with the +X side edges of the mesh patterns 23a and 23i of the light-emitting panel 20 of the light-emitting module 10.

As shown in FIG. 2, a connector 50 is a cuboid-shaped component part. Connected to the connector 50 is a cable that is pulled around from a direct current power supply. The connector 50 is mounted on the upper surface of the +X side edge of the flexible cable 40. When the connector 50 is mounted on the flexible cable 40, as illustrated in FIG. 10, a pair of terminals 50a of the connector 50 is connected to conductor patterns 43a and 43b, respectively, that constitute the conductor layer 43 through an opening 42a provided at the cover lay 42.

As illustrated in FIG. 2, a reinforcing plate 60 is a rectangular plate-shaped member having its longitudinal direction along the X-axis direction. The reinforcing plate 60 is formed from, for example, an epoxy resin or an acrylic resin. This reinforcing plate 60 can be attached to the lower surface of the flexible cable 40, as illustrated in FIG. 10. Therefore, the flexible cable 40 can be bent between the −X side edge of the reinforcing plate 60 and the +X side edge of the light-emitting panel 20.

Figure 11:
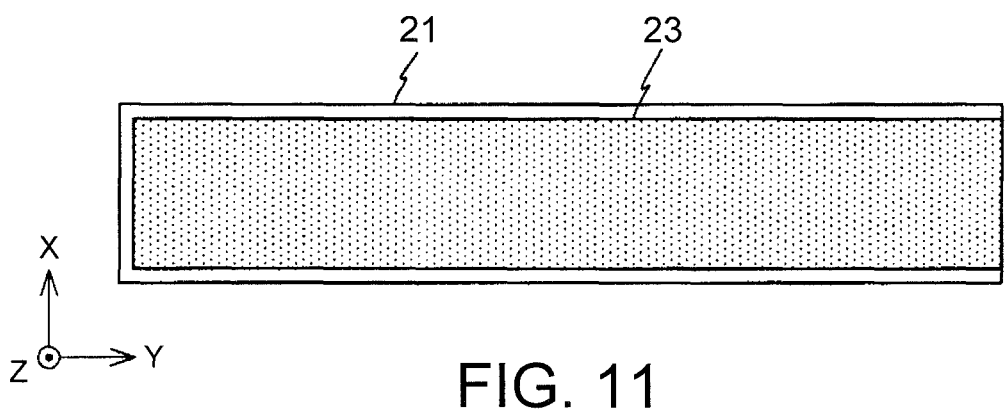
FIG. 11 is a diagram for explaining the procedure for manufacturing a mesh pattern.

Next, a method for producing the light-emitting panel 20 that constitutes the above-described light-emitting module 10 will be explained. First, a film 21 formed from PET is prepared. Then, as illustrated in FIG. 11, a mesh-shaped conductor layer 23 is formed over the entire surface of the film 21 by using a subtractive method or an additive method. Then, this conductor layer 23 is cut out using a laser, and thereby mesh patterns 23a to 23i are formed.

Figure 12:
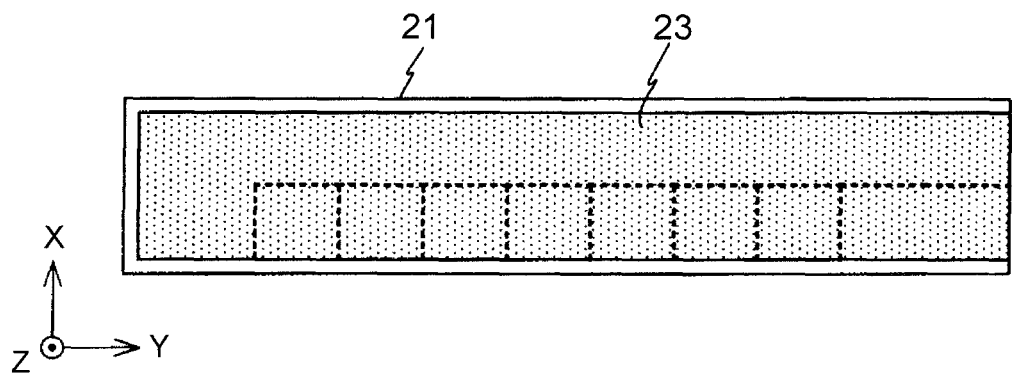
FIG. 12 is a diagram for explaining the procedure for manufacturing a mesh pattern.
Figure 13:
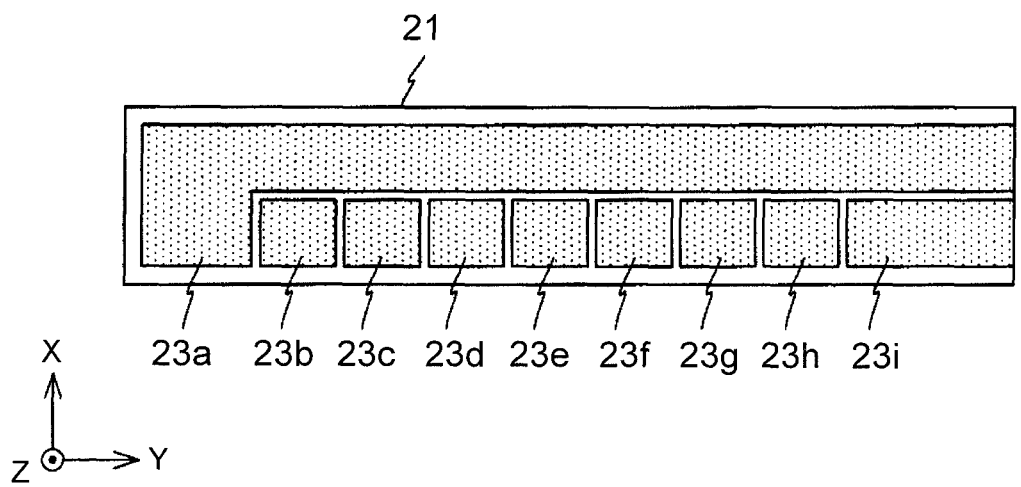
FIG. 13 is a diagram for explaining the procedure for manufacturing a mesh pattern.

Cutting of the conductor layer 23 is carried out by irradiating the conductor layer 23 formed on the surface of the film 21 with laser light, and then moving the laser spot of the laser light along the dotted lines shown in FIG. 12. Thereby, the conductor layer 23 is cut out along the dotted lines, and mesh patterns 23a to 23i are formed as shown in FIG. 13.

Figure 14:
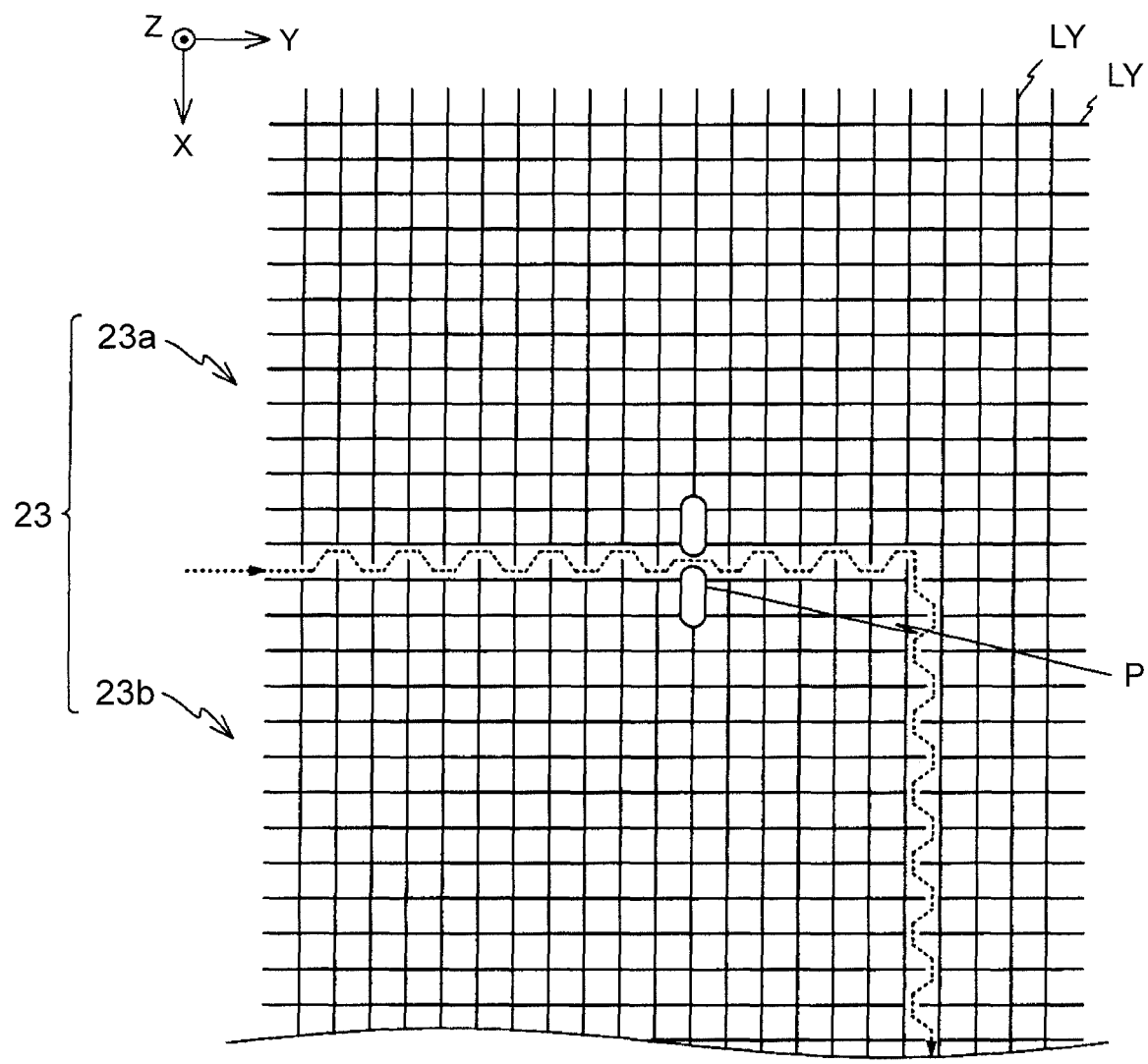
FIG. 14 is a diagram for explaining the procedure for manufacturing a mesh pattern.

FIG. 14 is a diagram showing a magnified view of the conductor layer 23. As shown in FIG. 14, when the conductor layer 23 is cut out by moving the laser spot, the laser spot is moved in a zigzag fashion with an amplitude that is smaller than the array pitch of the line patterns LX and LY, as shown by the dotted lines in the diagram. As a result, at the boundary between adjacent mesh patterns, an edge of one mesh pattern and an edge of the other mesh pattern are in a state of being alternately arrayed along the boundary.

Figure 15:
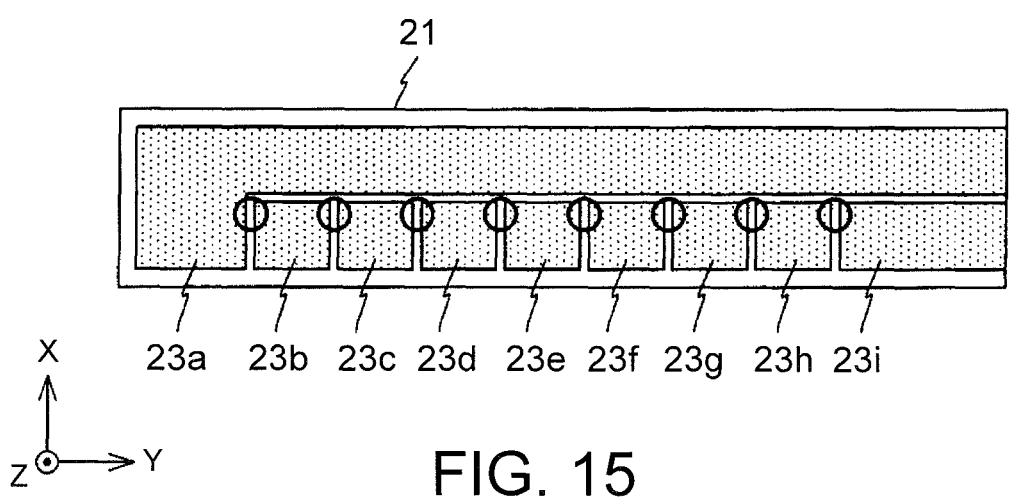
FIG. 15 is a diagram for explaining the procedure for manufacturing a mesh pattern.

In the present embodiment, as illustrated in FIG. 14, connection pads P are formed in advance on the conductor layer 23. The connection pads P are provided, when the conductor layer 23 is formed, correspondingly at the positions where the light-emitting elements 30 are mounted. When the laser spot of laser light moves over the surface of the conductor layer 23 along the dotted lines shown in FIG. 14, portions of the line patterns LX and LY in the vicinity of the route of movement of the laser spot melt down and then sublime. Thereby, the mesh patterns 23a to 23i are cut, and at the same time, a pair of connection pads P that are electrically insulated from each other is formed. In each of the light-emitting panels 20 of the light-emitting module 10, a pair of connection pads P is formed at the sites marked with the symbol ○ in FIG. 15.

Figure 16:
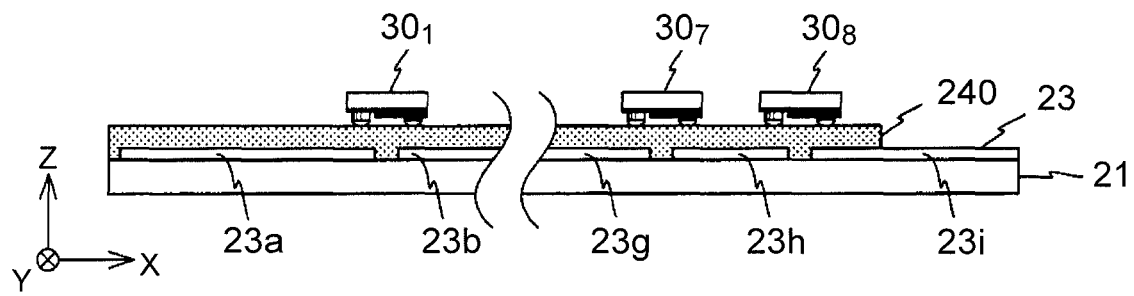
FIG. 16 is a diagram for explaining the procedure for manufacturing a light-emitting panel.

Next, as illustrated in FIG. 16, a resin sheet 240 having thermosetting properties is provided on the surface of the film 21 where the mesh patterns 23a to 23i have been formed. Then, the light-emitting elements $30_1$ to $30_8$ are disposed on the resin sheet 240. At this time, the positions of the light-emitting elements $30_1$ to $30_8$ are determined such that the connection pads P formed on the mesh patterns 23a to 23i are positioned immediately below the bump 37 of the light-emitting elements $30_1$ to $30_8$.

Figure 17:
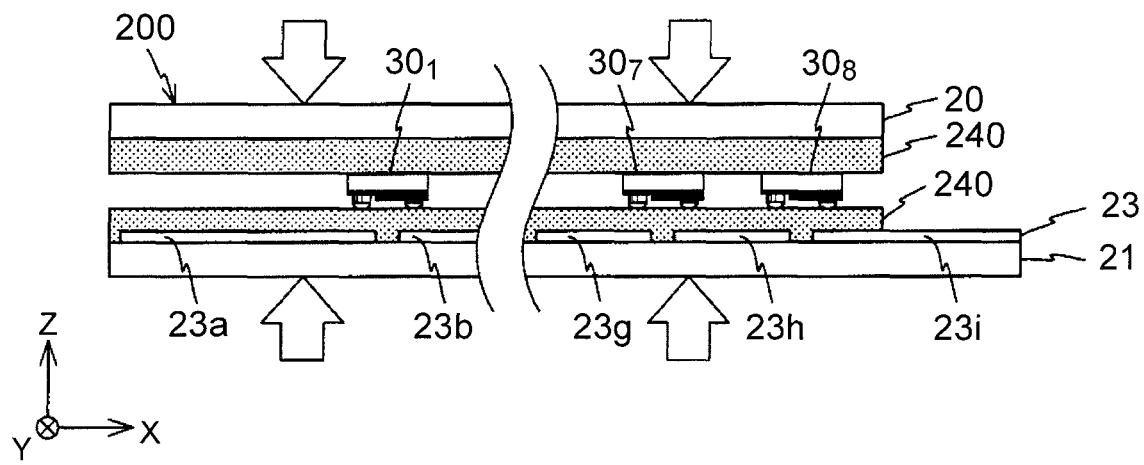
FIG. 17 is a diagram for explaining the procedure for manufacturing a light-emitting panel.

Next, as illustrated in FIG. 17, the film 22 having the resin sheet 240 provided on the lower surface is disposed on the upper surface side of the film 21, and thus a laminate 200 is formed. Then, this laminate 200 is heated and pressed in a vacuum atmosphere. As a result, the resin sheets 240 are softened and fill in between the conductor layer 23 as well as the films 21 and 22 and the light-emitting element 30 in a gapless manner. Furthermore, the bumps 37 formed in the light-emitting elements $30_1$ to $30_8$ penetrate through the resin sheet 240 and reach the mesh patterns 23a to 23i. Thereby, the bumps 37 of the light-emitting elements $30_1$ to $30_8$ are respectively electrically connected to the mesh patterns 23a to 23i. Subsequently, the resin sheets 240 having thermosetting properties are continuously heated and are cured thereby. As a result, the resin sheets 240 form a resin layer 24 that retains the light-emitting element 30 between the films 21 and 22, as shown in FIG. 3.

The resin that constitutes the resin layer 24 fills in around the bumps 37 so as to surround the sides of the bumps 37, when the resin sheets 240 are softened and fill in between the conductor layer 23 as well as the films 21 and 22 and the light-emitting element 30 in a gapless manner. Furthermore, the resin also partially fills in at the edges of the upper surface of the bumps 37.

To the light-emitting panel 20 configured as explained above, the flexible cable 40 having the connector 50 mounted thereon and also having the reinforcing plate 60 attached thereon is connected, as shown in FIG. 10, and thereby, a light-emitting module 10 as illustrated in FIG. 1 is completed.

Figure 18:
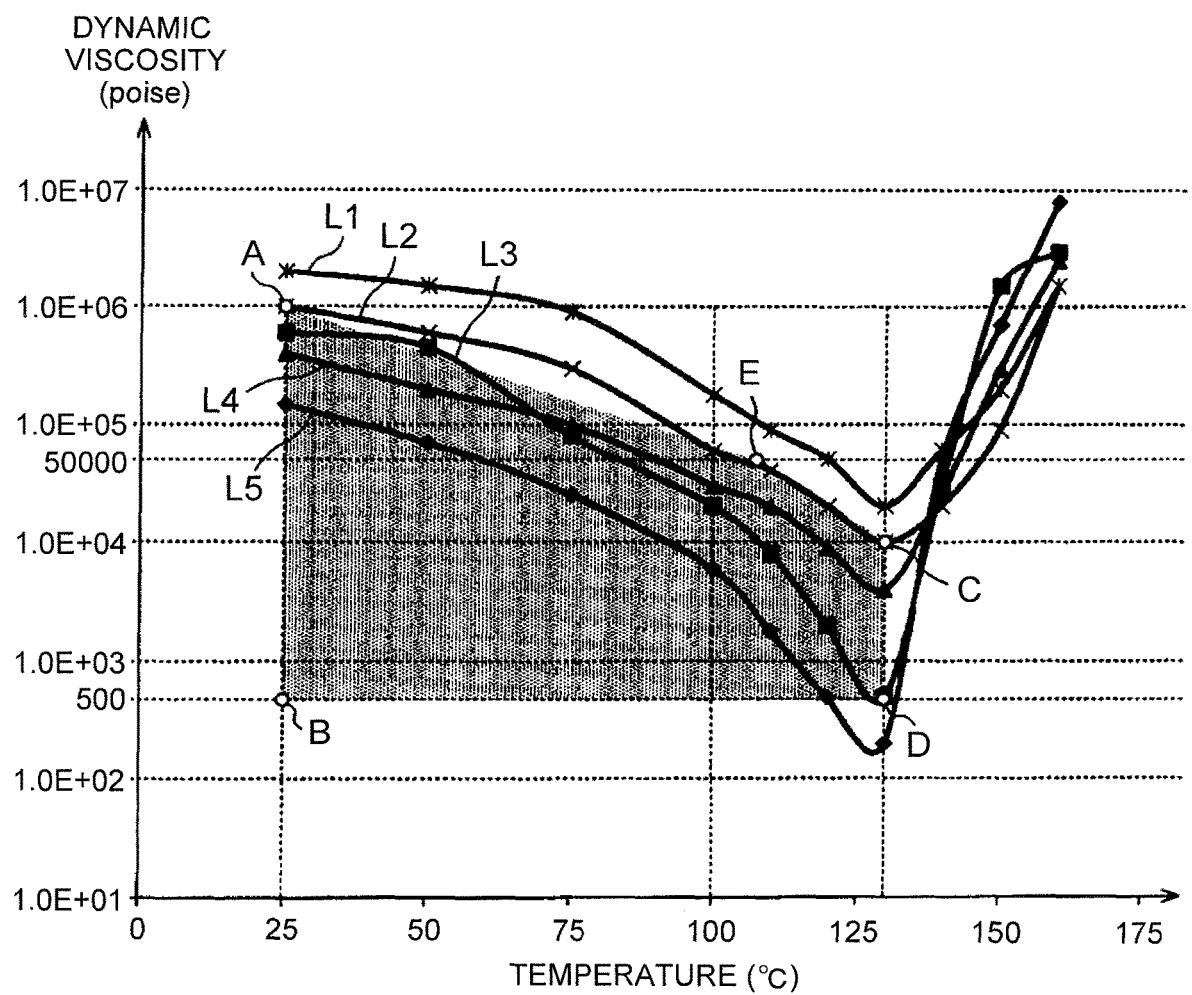
FIG. 18 is a diagram showing the dynamic viscosity before thermal curing of a thermosetting resin having thermosetting properties.

FIG. 18 is a diagram showing the dynamic viscosity in the initial state, that is, before thermal curing, of the resin sheet 240 having thermosetting properties. The axis of abscissa of the graph in FIG. 18 represents the temperature (° C.), and the axis of coordinate represents the dynamic viscosity (poise). Various curves L1 to L5 in FIG. 18 represent the viscoelastic characteristics before thermal curing of the resin sheet 240. The dynamic viscosity is obtained by measuring the dynamic viscoelasticity. The measurement of the dynamic viscoelasticity represents the stress of the resin sheet 240 when a constant, periodic sinusoidal strain is applied to the resin sheet 240. Generally, as the dynamic viscosity is higher, the resin sheet is harder, and as the dynamic viscosity is lower, the resin sheet becomes flexible.

In the resin sheet 240, light-emitting elements $30_1$ to $30_8$ are placed before vacuum thermocompression bonding, for example, as illustrated in FIG. 17. Therefore, it is preferable that the resin sheet 240 is soft to a certain extent. Specifically, for example, it is preferable that the resin sheet 240 is soft to the extent that when the light-emitting elements $30_1$ to $30_8$ are placed on the resin sheet 240 using an apparatus such as a mounter, the bumps 37 of the light-emitting elements $30_1$ to $30_8$ slightly sink into the resin sheet 240. When the resin sheet 240 is soft to a certain extent, the light-emitting elements $30_1$ to $30_8$ mounted by the mounter are in a state of being temporarily fixed to the resin sheet 240. Thereby, even when the film 21 having the light-emitting elements $30_1$ to $30_8$ mounted thereon is moved, or when the film 21 and the film 22 are superposed, the light-emitting elements $30_1$ to $30_8$ do not shift relative to the resin sheet 240, and the light-emitting elements $30_1$ to $30_8$ are in a state in which the positions are determined with high precision.

Generally, since mounting of the light-emitting elements $30_1$ to $30_8$ by a mounter or the like is carried out at room temperature (about 20° C. to 30° C.), for example, when the resin sheet 240 is at 25° C., it is preferable that the dynamic viscosity of the resin sheet 240 is 1.0E+06 poise or less, which is below the broken line that passes through point A.

Thermocompression bonding of the laminate 200 including the films 21 and 22, the resin sheet 240, the light-emitting elements $30_1$ to $30_8$, and the like is carried out at a temperature lower than the temperature at which the resin sheet 240 has the lowest melt viscosity, that is, a temperature lower than the Vicat softening temperature Mp at which the resin sheet 240 begins to harden. Then, the laminate 200 that has been subjected to thermocompression bonding is maintained, if desired, in a state of being pressed until the laminate reaches the Vicat softening temperature Mp at which the resin sheet 240 hardens. Therefore, if the dynamic viscosity is too low, it is thought that the resin sheet 240 may flow between the films 21 and 22, or the positions of the light-emitting elements $30_1$ to $30_8$ may be shifted along with the flow of the films 21 and 22. Therefore, it is preferable that the dynamic viscosity of the resin sheet 240 is 500 poise or higher, which is above the broken line that passes through point D, at the Vicat softening temperature Mp. That is, the minimum dynamic viscosity of the resin sheet 240 is desirably 500 poise or higher.

In a case in which the films 21 and 22 are formed from, for example, PET having a thickness of 100 μm, it is preferable that the Vicat softening temperature Mp is lower than the softening temperature of PET. Since the softening temperature of PET is about 180° C., the Vicat softening temperature Mp is, for example, 80° C. to 160° C. The Vicat softening temperature Mp is more preferably 80° C. to 150° C., and generally 100° C. to 130° C. Therefore, at a temperature of 130° C., the dynamic viscosity is desirably 500 poise or higher.

While the laminate 200 including the films 21 and 22, the resin sheet 240, the light-emitting elements $30_1$ to $30_8$, and the like is being subjected to thermocompression bonding, for example, as illustrated in FIG. 3, a heating treatment (preheating) for the resin sheet 240 to wrap around the circumferences of the light-emitting elements $30_1$ to $30_8$ in a gapless manner may be carried out. During this preheating, the resin sheet 240 must be softened to a certain extent when the temperature of the resin sheet 240 has risen up to the Vicat softening temperature Mp. Therefore, it is preferable that the dynamic viscosity of the resin sheet 240 is 1.0E+04 poise or less, which is below the broken line that passes through point C, at the Vicat softening temperature Mp. Therefore, it is desirable that the dynamic viscosity is 1.0E+04 poise or less at 130° C.

In the present embodiment, when the laminate 200 is subjected to thermocompression bonding, the bumps 37 of the light-emitting elements $30_1$ to $30_8$ penetrate through the resin sheet 240 and reach the conductor layer 23 formed on the film 21. Therefore, during the preheating, after the thermocompression bonding is initiated, the laminate 200 is heated approximately to 100° C. to 110° C. until a desired pressure is applied to the laminate 200. Therefore, it is preferable that the dynamic viscosity of the resin sheet 240 is 50,000 poise or less, which is below the broken line that passes through point E, at a temperature of about 110° C.

When the above-described conditions are considered, it is preferable that the resin layer 24 of the light-emitting module 10 is configured using a resin sheet 240 in which the profile of the dynamic viscosity over a temperature range of from about 25° C. to about 130° C. has dynamic viscoelasticity characteristics that are represented by a curve that is included in a region defined by straight lines binding the points A, B, C, D, and E in FIG. 18.

For example, in the example shown in FIG. 18, it is desirable to configure the resin layer 24 of the light-emitting module 10 using a resin sheet 240 having the dynamic viscoelasticity characteristics represented by curve L3 and L4. Furthermore, it is also acceptable to use a resin sheet 240 having dynamic viscoelasticity characteristics represented by curve L2. It is because a resin sheet 240 having dynamic viscoelasticity characteristics represented by curve L2 satisfies the conditions for dynamic viscosity required for the formation of a resin layer at the sites of point A to point E.

Figure 19:
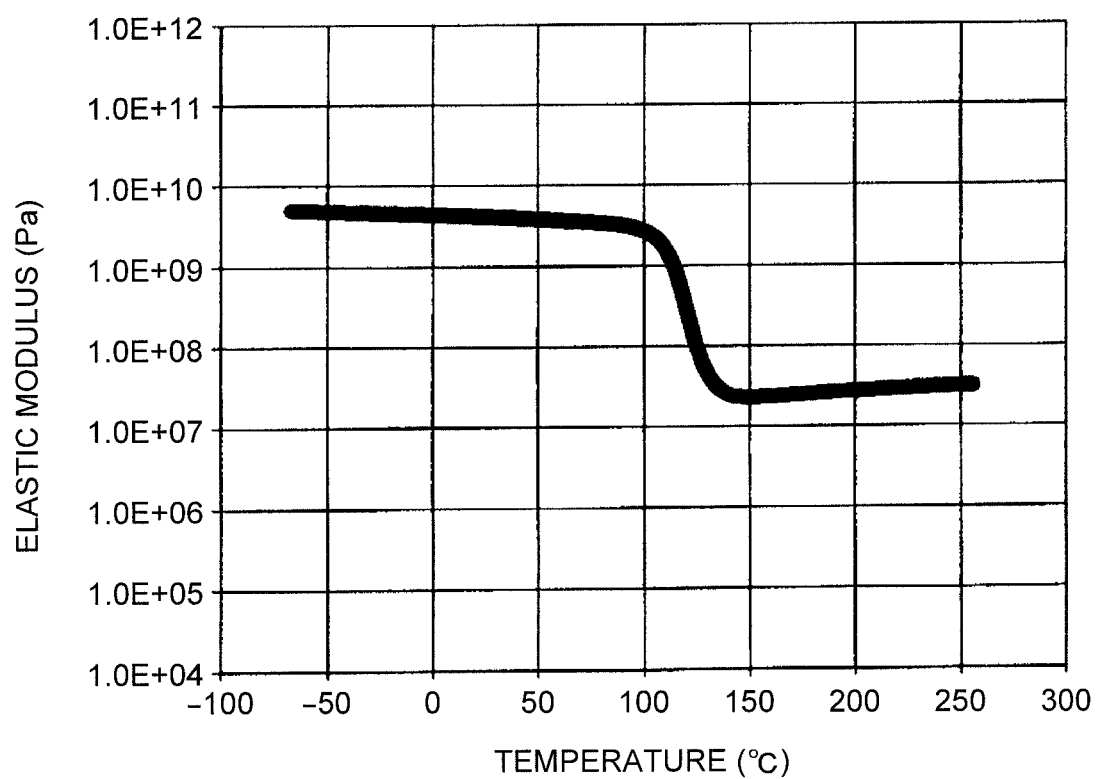
FIG. 19 is a diagram showing the tensile storage modulus of a resin layer obtainable as a thermosetting resin is cured and integrated.

FIG. 19 is a diagram showing the tensile storage modulus of the resin layer 24 obtainable when the resin sheets 240 described above are cured and integrated. As shown in FIG. 19, for example, a resin sheet 240 having dynamic viscoelasticity characteristics represented by L2 to L3 in FIG. 18 is such that after the resin sheet is cured and becomes the resin layer 24, the tensile storage modulus is constant over a range from a temperature lower than or equal to normal temperature to 100° C., and the resin layer 24 exhibits stabilized characteristics. Furthermore, even in a case in which the resin layer is heated above the softening temperature, the viscosity decreases steeply in the beginning; however, subsequently, the tensile storage modulus becomes constant, and the resin layer exhibits stable characteristics. Therefore, a light-emitting module 10 having high reliability can be provided by using the above-described resin sheet 240.

The tensile storage modulus of the resin sheet 240 after being thermally cured is in the range of 1 to 10 GPa at a temperature in the range of −50° C. to 100° C., and the change in the tensile storage modulus occurs within the range of one digit number (10 times).

As described above, the light-emitting panel 20 produced by subjecting the laminate 200 to thermocompression bonding is such that as schematically illustrated in FIG. 8, the films 21 and 22 have a curved shape along the light-emitting elements $30_1$ to $30_8$ (hereinafter, for the convenience of explanation, the light-emitting elements $30_1$ to $30_8$ may be simply indicated as light-emitting elements 30). These films 21 and 22 maintain the shape by means of the resin layer 24; however, when a certain length of time passes, the film 21 may be detached from the conductor layer 23 due to the stress attributed to the bending of the film 21. Detachment of the film 21 is clearly seen in the vicinity of the bumps 37 of the light-emitting elements 30. Therefore, in the production process for the light-emitting panel 20, the conductor layer 23 of the film 21 is depressed along the shapes of the bumps 37 due to the pressing of the bumps 37, and the radius of curvature of those depressions is adjusted to be larger than or equal to a certain value. The reason for this will be explained below.

Figure 20:
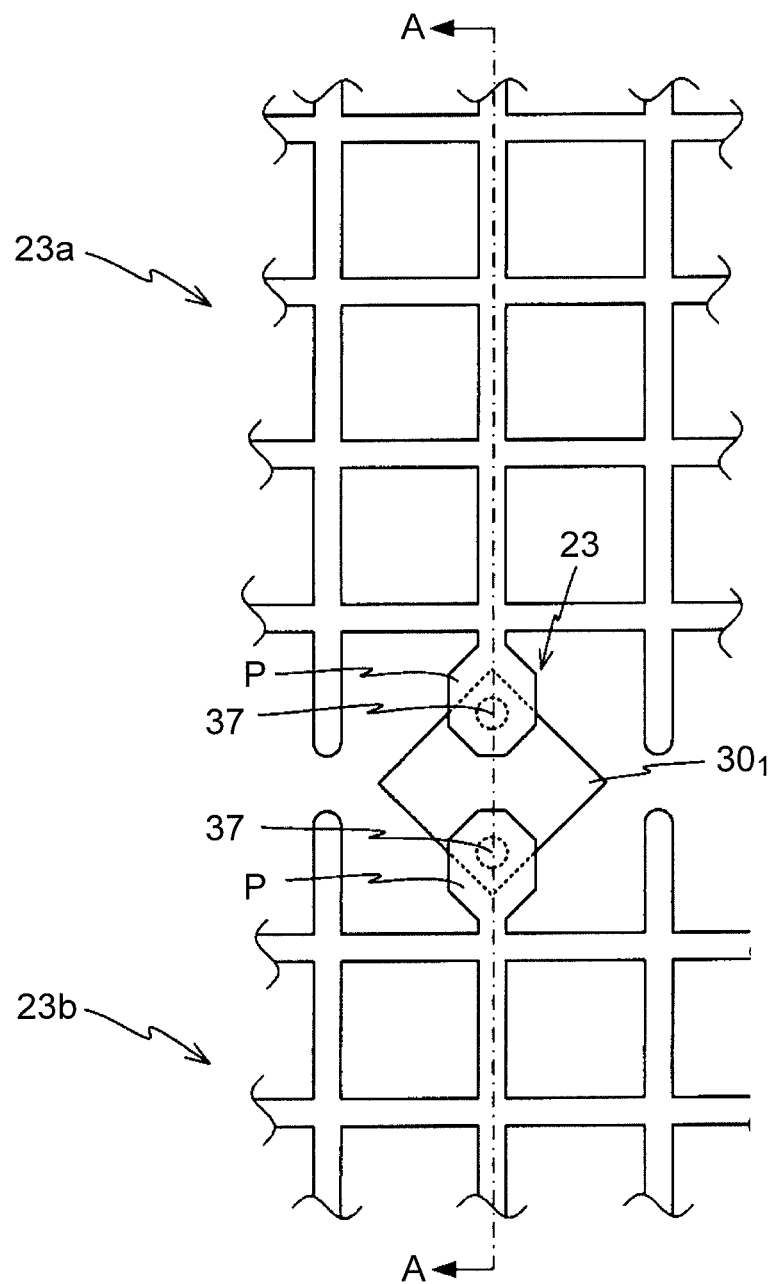
FIG. 20 is a diagram illustrating a magnified view of the light-emitting element connected to the mesh pattern.
Figure 21:
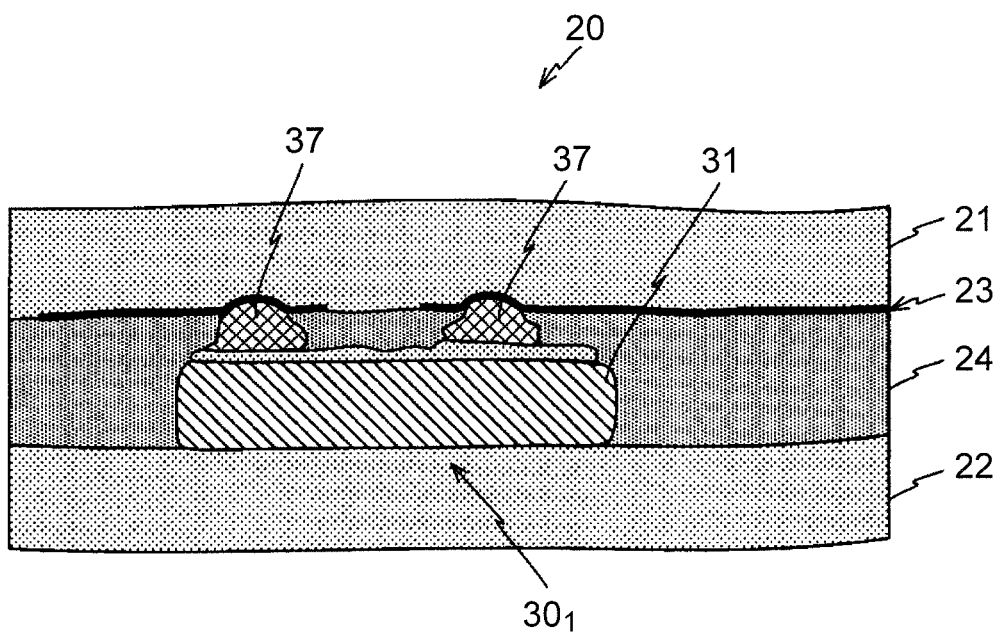
FIG. 21 is a diagram illustrating a cross-section of the light-emitting module obtained by cutting the module along line A-A.

FIG. 20 is a diagram showing a magnified view of the light-emitting element $30_1$ connected to the mesh patterns 23a and 23b of the light-emitting panel 20 illustrated in FIG. 1. As show in FIG. 20, the bumps 37 formed in the light-emitting elements 30 are connected to the connection pads P of the mesh patterns. FIG. 21 is a diagram showing a portion of a cross-section of the light-emitting module 10 shown in FIG. 20, formed by cutting along the line A-A. When the bumps 37 of the light-emitting elements 30 are connected to the connection pads P, the lower surface of the film 21 is brought to a state of being depressed along the bumps 37, together with the conductor layer 23 having the connection pads P formed thereon.

Figure 22:
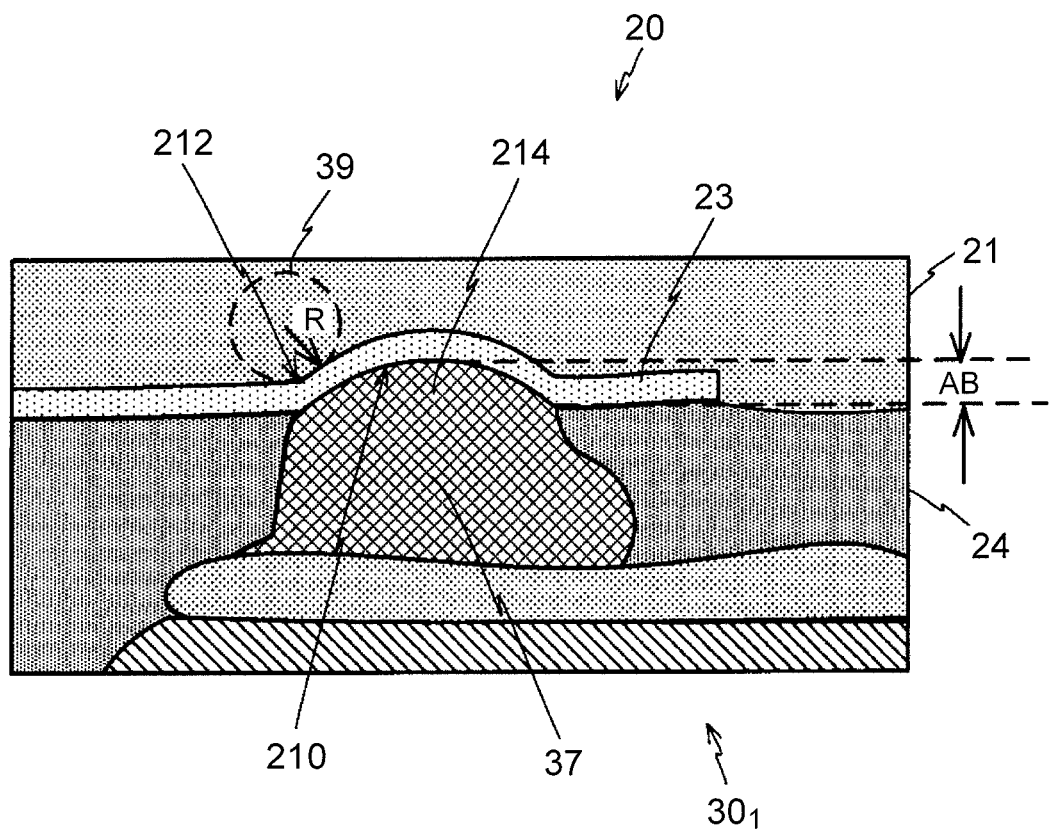
FIG. 22 is a cross-sectional view illustrating the light-emitting element that constitutes a light-emitting device, as well as the resin layer, a conductor layer, and a film located in the periphery of the light-emitting element.

FIG. 22 is a diagram showing a magnified view of a bump 37 shown in FIG. 21 and its surroundings. As can be seen by referring to FIG. 22, in the light-emitting panel 20 that constitutes the light-emitting module 10, a protrusion 214 that protrudes toward the conductor layer 23 and the film 21 is formed in the bump 37 of the light-emitting element 30 from the lower surface of the film 21. This protrusion 214 comes into contact with the conductor layer 23. Thereby, the bump 37 is electrically connected to the conductor layer 23.

Furthermore, in the light-emitting panel 20 of the light-emitting module 10, the conductor layer 23 is in a state of being depressed along the bumps 37 at the contact area 210 between the bumps 37 and the conductor layer 23. Thereby, the contact area in which the bumps 37 and the conductor layer 23 come into contact with each other increases. As a result, the resistance between the bumps 37 and the conductor layer 23 is decreased. Therefore, when only the viewpoint of securing electrical connection is considered, it is desirable that the film 21 and the conductor layer 23 are largely depressed.

Figure 23:
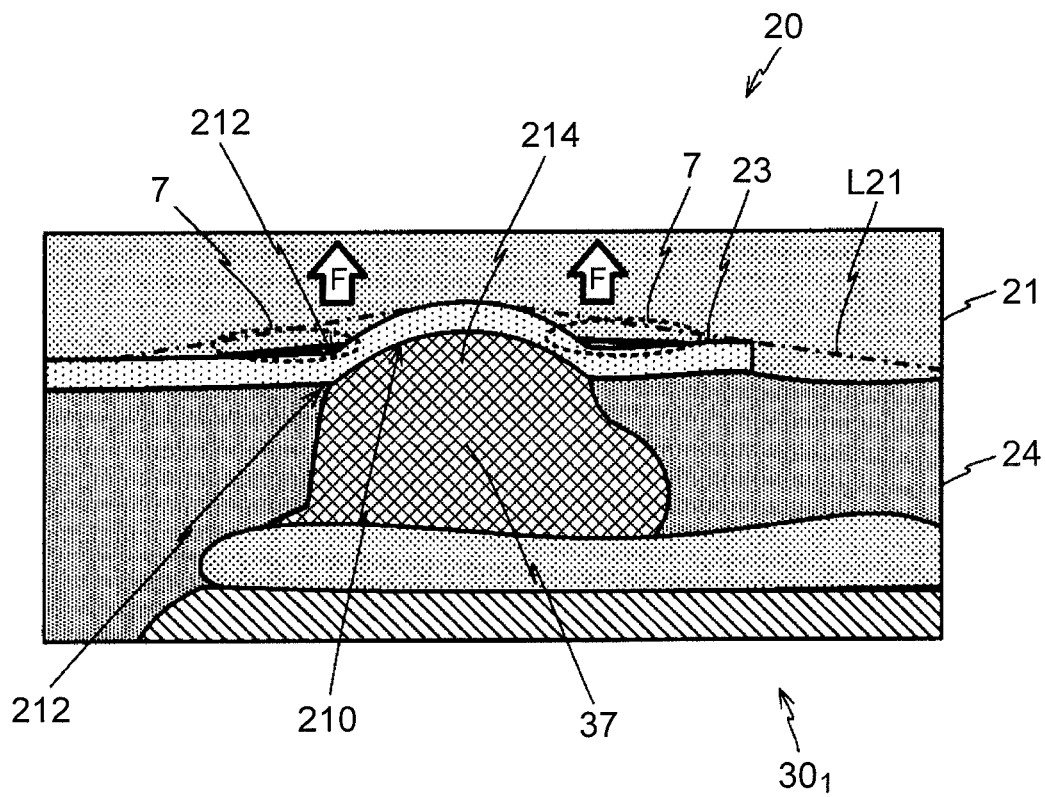
FIG. 23 is a diagram illustrating a gap produced near a contact area between a bump and the conductor layer in the light-emitting element of the light-emitting panel.
Figure 24:
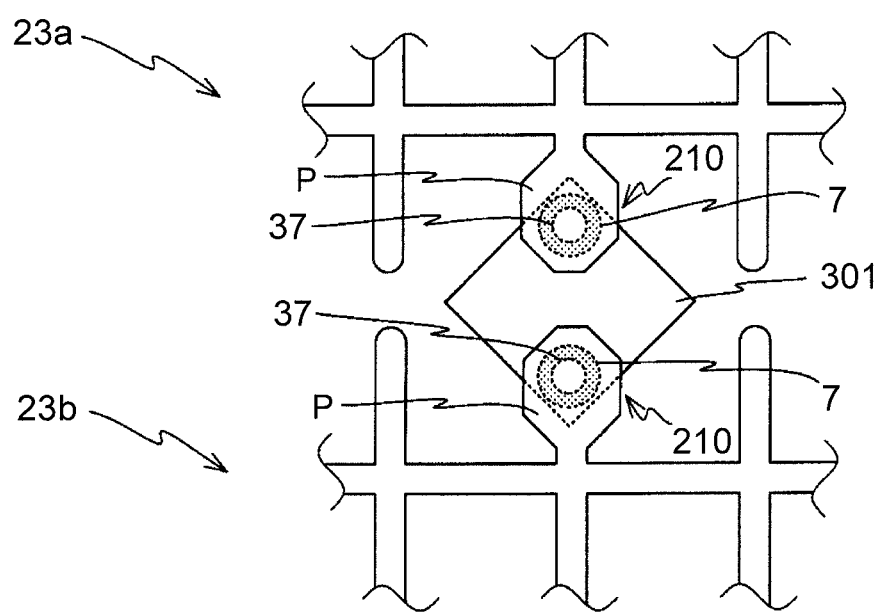
FIG. 24 is a diagram illustrating a magnified view of the vicinity of the contact area between the bump and the mesh pattern in the light-emitting element.

FIG. 23 is a diagram illustrating the film 21 detached from the conductor layer 23. As shown in FIG. 23, in a case in which both the film 21 and the conductor layer 23 are depressed along the bumps 37, the conductor layer 23 undergoes plastic deformation; however, the film 21 undergoes elastic deformation. Therefore, on the film 21, an elastic force F by which the film 21 tends to be detached from the conductor layer 23 and restore to the position indicated by a long-dashed short-dashed line L21 in FIG. 23, is applied. Therefore, when the resin layer 24 adhered to the film 21 has been degraded over years, the film 21 may be detached from the conductor layer 23, and thereby a gap 7 may be formed. As shown in FIG. 24 in a colored form, the gap 7 is formed around the bump 37. This gap 7 is formed by the elastic force F generated in the depressed film 21. Thus, during the production process for the light-emitting panel 20, the extent of depression in the film 21 along the bumps 37 is limited.

Specifically, as shown in FIG. 22, a circle 39 that contacts the conductor layer 23 at at least three points is defined in the outer edge 212 of the contact area 210 of the conductor layer 23 that is in contact with the bump 37. The radius R of the circle 39 defined as such may be a value almost equal to that of the radius of curvature R of the film 21 at the contact area 210. Furthermore, in the contact area 210 between the bump 37 and the conductor layer 23, the length in which the bump 37 has penetrated into the side of the conductor layer 23 and the film 21 is defined as the amount of bite AB of the bump 37.

When the light-emitting panel 20 is produced, detachment between the film 21 and the conductor layer 23 can be prevented by adjusting the radius of curvature R to be 20 µm or larger. In this case, the amount of bite AB become 15 µm or less, according to the relation with the radius of curvature R.

In the production process for the light-emitting panel 20, the laminate 200 illustrated in FIG. 17 is subjected to a vacuum thermocompression bonding process such that the radius of curvature R of the film 21 acquires a predetermined value. The vacuum thermocompression bonding process is a process for integrating the various parts that constitute the laminate 200 by heating and pressing the laminate 200.

In regard to the vacuum thermocompression bonding process, a heating pattern of raising the temperature of the laminate 200 that is disposed between the plates of a pressing apparatus, under first heating conditions, and a heating pattern of raising the temperature of the laminate 200 under second heating conditions may be considered. The first heating conditions are, for example, conditions that specify a heating pattern of raising the temperature of the laminate 200 up to temperature T over a relatively long time period. Furthermore, the second heating conditions are conditions that specify a heating pattern of raising the temperature of the laminate 200 up to temperature T in a relatively short time. When the thermocompression bonding process is carried out, the laminate 200 is heated to temperature T, which is higher than or equal to the curing temperature. The laminate 200 that has been heated to temperature T is cooled to room temperature.

The temperature T for the vacuum thermocompression bonding is set to fall between a temperature lower by 10 (° C.) than the Vicat softening temperature Mp of the films 21 and 22, and a temperature higher by 30 (° C.) than the Vicat softening temperature Mp of the films 21 and 22.

$$Mp-10 \leq T \leq Mp+30$$

It is because when the temperature T is below the temperature that is lower by 10 (° C.) than the Vicat softening temperature Mp of the films 21 and 22 (T<Mp-10), there is a risk that softening of the films 21 and 22 may occur insufficiently, and the close adhesiveness of the films 21 and 22 to the light-emitting elements $30_1$ to $30_8$ may be deteriorated. Furthermore, it is because when the heating temperature T is above the temperature that is higher by 30 (° C.) than the Vicat softening temperature Mp of the films 21 and 22 (Mp+30<T), there is a risk that the films 21 and 22 may be softened, while the resin sheet 240 may become too soft, and a defective shape or the like may be obtained.

It is speculated that the radius of curvature R of the film 21 is mainly dependent on the magnitude of the pressure applied to the laminate 200 during the thermocompression bonding process. Therefore, when the light-emitting panel 20 is produced, the radius of curvature R of the film 21 is adjusted to be 20 µm or larger by mainly adjusting the pressure applied to the laminate 200.

By adjusting the radius of curvature R of the film 21 to be 20 µm or larger, the reliability of the light-emitting panel 20 and furthermore, the reliability of the light-emitting module 10, can be enhanced. Hereinafter, the invention will be described by way of Examples.

EXAMPLES

As Examples of the light-emitting panel 20 according to the embodiment described above, a plurality of light-emitting panels 20 was produced under various conditions, and a reliability test was conducted for a plurality of the light-emitting panels 20 thus produced.

In a vacuum thermocompression bonding process for the light-emitting panels 20 used for the reliability test, the pressure applied to the laminate 200 was set to two types, namely, a low pressure and a high pressure. Furthermore, the material of the films 21 and 22 that constituted the laminate 200 was PET, and the material of the conductor layer 23 was copper (Cu). In each of the light-emitting panels 20 used in the reliability test, nine light-emitting elements 30 were connected in series.

In the reliability test, a current of about 10 mA was supplied to each of the light-emitting elements 30 of a plurality of light-emitting panels 20 in an environment at an air temperature of 85° C. and a humidity of 85%. The current supplied to the light-emitting element 30 was specified such that, for example, the temperature of the light-emitting element 30 would rise up to the heat-resistant temperature. The time for supplying the current to the light-emitting element 30 was set to 168 hours. For a light-emitting panel 20 through which the current had been passed, an observation of the bumps 37 of the light-emitting element 30 at the positions that had been determined in advance was made, and the presence or absence of detachment between the film 21 and the conductor layer 23 was checked.

The following Table 1 is a table showing the results of the reliability test. As shown in Table 1, the test results are described for four methods under the following vacuum thermocompression bonding conditions for the laminate 200: (1) decrease of the applied pressure under the heating conditions 1; (2) increase of the applied pressure under the heating conditions 1; (3) decrease of the applied pressure under the heating conditions 2; and (4) increase of the applied pressure under the heating conditions 2, at various values of the radius of curvature R in the range of 5 to 40 μm. The denominator of a value in the test results represents the number of samples, while the numerator represents the number of samples in which detachment was recognized.

For example, in regard to the value indicated under the conditions of (1) decrease of the applied pressure under the heating conditions 1 at a radius of curvature of 5 μm, the denominator represents the total number of samples that were produced under the conditions of decreasing the applied pressure under the heating conditions 1 and acquired a radius of curvature R of 5 μm. Furthermore, the numerator represents the number of samples in which detachment of the film 21 and the conductor layer 23 was recognized among the samples described above.

Furthermore, in regard to the reference characters SG, G, S, and N in the test results, SG (Significantly Greater) means that a noticeably large detachment in the structure has occurred, which proceeds from a depression of the film 21 toward a planar part. G (Greater) means that a large detachment in the structure, which proceeds from a depression of the film 21 toward a planar part, has occurred. S (Smaller) means that a small detachment in the structure has occurred. N (None) means that no detachment is recognized. Regarding any light-emitting panel 20 in which detachment in the state represented by SG or G has occurred, actual use of the light-emitting panel is difficult or impossible. The reference symbol — represents that there is no sample for which the reliability test has been conducted.

Table showing the conditions for vacuum thermocompression bonding, the radius of curvature R of a bump bent part, and the state of detachment

TABLE 1

| Conditions for vacuum thermocompression bonding | | R: Radius of curvature (μm) | | | | | | | | |
| --- | --- | --- | --- | --- | --- | --- | --- | --- | --- | --- |
| Heating conditions | Applied pressure | 5 | 10 | 13 | 15 | 20 | 25 | 30 | 35 | 40 |
| 1 | Low pressure | 3/9 SG | 1/9 G | 1/9 S | 0/9 N | 0/9 N | 0/9 N | — | — | — |
| 1 | High pressure | 5/9 SG | 3/9 SG | 1/9 S | 1/9 N | 0/9 N | 0/9 N | — | — | — |
| 2 | Low pressure | 9/9 SG | 2/9 G | 1/9 S | 1/9 N | 0/240 N | 0/9 N | 0/9 N | 0/9 N | — |
| 2 | High pressure | 9/9 SG | 1/9 G | 1/9 S | 0/3 N | 0/9 N | 0/9 N | 0/9 N | 0/9 N | — |

As shown in Table 1, in a case in which the radius of curvature R was about 5 μm, the occurrence of detachment in the state represented by the reference character SG was recognized in many samples. In a case in which the radius of curvature R was about 10 μm, the occurrence of detachment in the state represented by the reference character SG or S was recognized in many samples. In a case in which the radius of curvature R was about 13 μm, the occurrence of detachment in the state represented by the reference character S was recognized in many samples; however, any sample without the occurrence of detachment was not recognized. In a case in which the radius of curvature R was about 15 μm, some samples without the occurrence of detachment were recognized. In a case in which the radius of curvature R was about 20 μm or larger, any sample with the occurrence of detachment was not at all recognized.

From the results given above, it can be seen that when the light-emitting panel 20 is produced, it is preferable to adjust the radius of curvature R to be 20 μm or larger. Furthermore, when the use applications and the like of the light-emitting module 10 including the light-emitting panel 20 are taken into consideration, it can be said that it is preferable to adjust the radius of curvature R to be 25 μm or larger.

As explained above, in the light-emitting panel 20 that constitutes a light-emitting module 10, detachment between the film 21 and the conductor layer 23 can be prevented by adjusting the radius of curvature R to be 20 μm or larger when the film 21 is depressed by a bump 37. As the result, reliability of the light-emitting module 10 can be enhanced.

Furthermore, detachment between the film 21 and the conductor layer 23 can be prevented more effectively by adjusting the radius of curvature R to be 25 μm or larger when the film 21 is depressed by a bump 37. As the result, reliability of the light-emitting module 10 can be enhanced.

In the light-emitting module 10, the light-emitting elements 30$_2$ to 30$_8$ are connected to the mesh patterns 23*a* to 23*i*. These mesh patterns 23*a* to 23*i* are formed from a metal thin film having a line width of about 10 μm. A metal such as copper (Cu) or silver (Ag) is an opaque metal material; however, the openings of the mesh pattern transmit light. Therefore, light transmissive property and flexibility of the light-emitting module 10 can be sufficiently secured. Furthermore, since the mesh patterns 23a to 23i are formed in a planar form, the resistance value of the circuit that supplies electric power to the light-emitting element 30 can be made small. Thereby, electric power can be supplied efficiently to the light-emitting element 30.

Thus, embodiments of the invention have been explained above; however, the invention is not intended to be limited to the above-described embodiments. For example, in the above-described embodiments, the resin layer 24 was formed from a thermosetting resin. Without being limited to this, the resin layer 24 may also be formed from a thermoplastic resin. The details of a resin layer formed from a thermoplastic resin, which constitutes a light-emitting module, are disclosed in WO 2014/156159 A. The content disclosed in WO 2014/156159 A (U.S. Ser. No. 14/858,241) has been partially incorporated in the present specification, and a detailed explanation on the resin layer formed from a thermoplastic resin will not be repeated here.

In the embodiments described above, mesh patterns 23a to 23i were formed by forming a mesh-shaped conductor layer 23 and then cutting the conductor layer 23 using a laser. Without being limited to this, it is also acceptable that a solid conductor layer is formed over the entire surface, and then mesh processing of the conductor layer and cutting processing of the mesh patterns 23a to 23i are carried out simultaneously by a single-time photoetching process. Furthermore, mesh patterns 23a to 23i may also be formed by a single-time printing process.

Regarding drawing of the mesh patterns 23a and 23i, the mesh patterns 23a and 23i may be superposed with conductor patterns 43a and 43b in the vicinity of the light-emitting panel 20, and thereby contact between the mesh patterns and the conductor patterns may be achieved. Furthermore, this contact may also be achieved by leaving a conductor layer (solid region) that is not subjected to mesh processing at the edges of the mesh patterns 23a and 23i, and superposing the conductor patterns 43a and 43b thereon.

In the embodiments, eight light-emitting diodes were connected in series, and the power supply line and the serial connection wiring part were formed in a mesh pattern. However, a two-dimensional array in which the serial connection of the light-emitting diodes is further connected in parallel may also be employed.

In the above-described embodiments, the conductor layer 23 may be formed on the upper surface of the film 22 (surface on the +Z side in FIG. 3) or may be formed on the lower surface of the film 21 (surface on the −Z side in FIG. 3). It is also acceptable that the conductor layer 23 is formed on both the upper surface of the film 22 and the lower surface of the film 21. For example, when the conductor layer 23 is formed only on the upper surface of the film 22 (surface on the +Z side in FIG. 3), the electrode of the light-emitting elements $30_1$ to $30_8$ are connected to the conductor layer 23 formed on the upper surface of the film 22. When the conductor layer 23 is formed on both the upper surface of the film 22 and the lower surface of the film 21, the electrodes of the light-emitting elements $30_1$ to $30_8$ are connected to the conductor layer formed on both the upper surface of the film 22 and the lower surface of the film 21.

In the above-described embodiments, the films 21 and 22 are not limited to an insulating resin (sheet or the like) having light transmission properties, and the films may be formed from, for example, an inorganic material having insulating properties and light transmission properties in combination, such as glass. However, in a case in which glass substrates are used as the films 21 and 22, the light-emitting module 10 is not bendable. In the case of imparting bendability to the light-emitting module 10, it is preferable to use films 21 and 22 formed from a material having light transmissive property and bendability. It is also acceptable that one of the films 21 and 22 is formed from a material having bendability, such as an insulating resin, and the other is formed from a rigid material such as a glass substrate.

In the light-emitting module 10, a conductor layer 23 formed from a transparent conductive material such as indium tin oxide (ITO) may also be formed, instead of the mesh-shaped conductor layer 23, over the entire lower surface of the film 21 using a sputtering method or a vapor deposition method. Since a conductor layer 23 formed from ITO also has high transparency and flexibility, light transmissive property and flexibility of the light-emitting module 10 can be sufficiently secured. A detailed explanation of a conductor layer formed from ITO is specifically disclosed in WO 2015/083366 A. The content disclosed in WO 2015/083366 A (U.S. Ser. No. 15/078,321) has been partially incorporated in this specification, and a detailed explanation on the conductor layer formed from ITO will not be repeated here.

Figure 25:
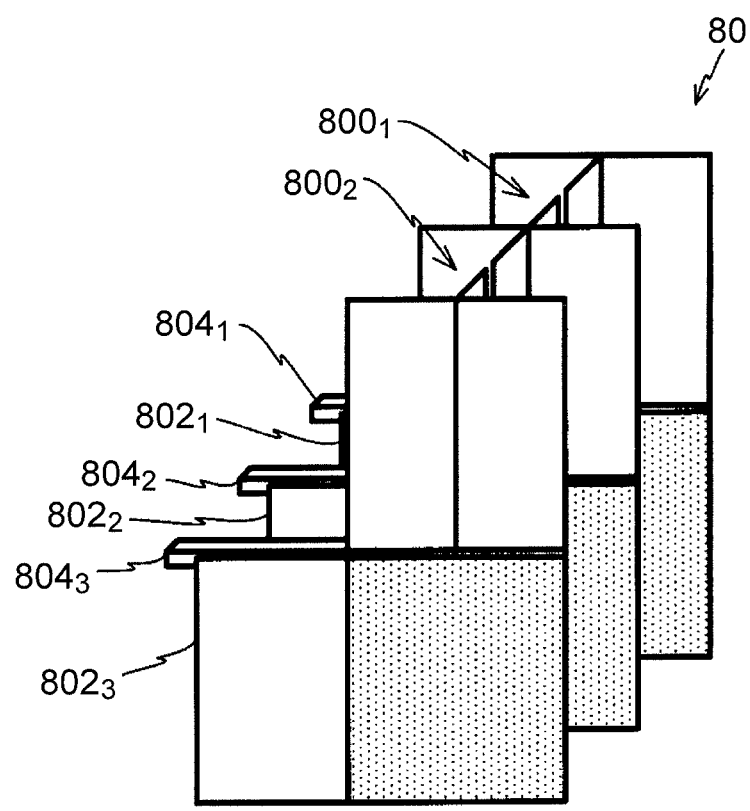
FIG. 25 is a diagram illustrating a security gate where the light-emitting module according to the embodiment is used.
Figure 26:
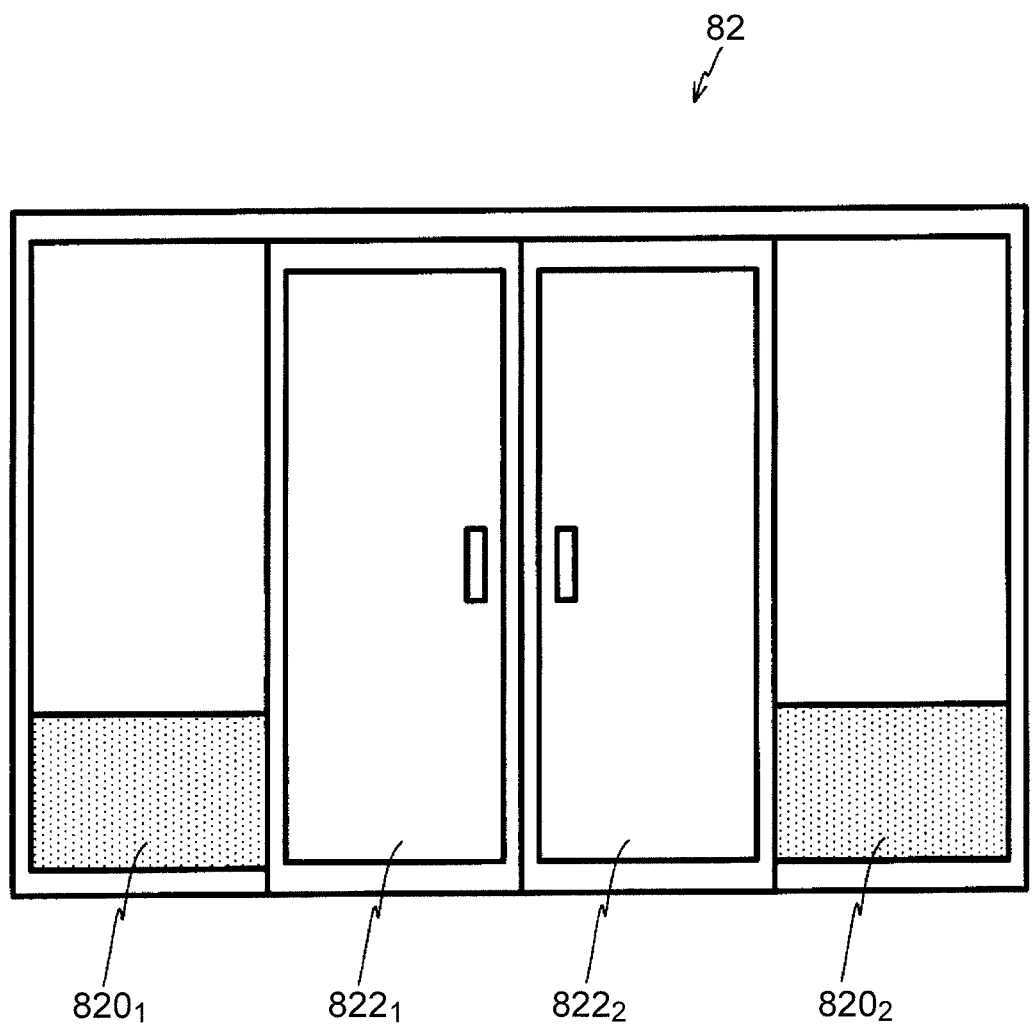
FIG. 26 is a diagram illustrating an automatic door where the light-emitting module according to the embodiment is used.

Next, use applications of the light-emitting module 10 will be described with reference to FIG. 25 and FIG. 26. FIG. 25 is a diagram illustrating a security gate 80 in which the light-emitting module 10 according to the embodiments is used. FIG. 26 is a diagram illustrating an automatic door 82 in which the light-emitting module 10 according to the embodiments is used.

In the security gate 80 illustrated in FIG. 25, the light-emitting module 10 is used in flappers $800_1$ and $800_2$ or main bodies $802_1$, $802_2$, and $802_3$. The light-emitting modules 10 disposed in the flappers $800_1$ and $800_2$ or the main bodies $802_1$, $802_2$, and $802_3$ emit blue light or red light. A card is read by card readers $804_1$, $804_2$, and $804_3$, and consequently, it is determined whether the card holder is passable through the security gate 80.

When it is determined that the card holder is passable, the light-emitting modules 10 disposed in the flappers $800_1$ and $800_2$ or the main bodies $802_1$, $802_2$, and $802_3$ conduct electricity so as to emit blue light. Meanwhile, when it is determined that the card holder is not passable, the light-emitting modules 10 conduct electricity so as to emit red light. Alternatively, when it is determined that the card holder is passable through the security gate 80, the light-emitting modules 10 disposed in the flappers $800_1$ and $800_2$ conduct electricity so as to display a message such as "Welcome" or "Thank you".

In the automatic door 82 illustrated in FIG. 26, the light-emitting module 10 is used in guard fences $820_1$ and $820_2$, and doors $822_1$ and $822_2$. The light-emitting modules 10 used in the guard fences $820_1$ and $820_2$ conduct electricity so as to display a predetermined mark when a person who is about to pass through the automatic door 82 comes close to the automatic door 82. Furthermore, the light-emitting modules 10 used in the door $822_1$ and $822_2$ conduct electricity such that light is turned on when a person who is about to pass through the automatic door 82 comes close to the automatic door 82, the light is turned off when the doors $822_1$ and $822_2$ are opened, and the light is turned on again when the doors $822_1$ and $822_2$ are closed.

Furthermore, regarding other use applications of the light-emitting module of the present embodiments, the features of bendability, light transmissive property, and the property of emitting light through both surfaces can be utilized. The light-emitting modules of the present embodiments may be incorporated into a decorative appliance so as to conform to a curved shape or the like of the decorative appliance, and the light-emitting modules may be caused to emit light into various patterns, characters, and the like. Furthermore, since the light-emitting modules have light transmissive property, a plurality of light-emitting modules may be superposed, and the respective light-emitting modules may be caused to emit light in different patterns. The light-emitting modules of the present embodiment may also be incorporated into tail lamps of electric trains, brake lights of streetcars or bicycles, and the like, so as to conform to the shape of the appliances.

Embodiments of the invention have been explained; however, these embodiments are suggested as examples and are not intended to limit the scope of the invention. These novel embodiments can be carried out in other various forms, and various simplification, substitutions, and modifications can be made to the extent that the gist of the invention is maintained. These embodiments or modifications thereof are included in the scope and gist of the invention and are also included in the inventions described in the claims as well as a scope equivalent thereto.

What is claimed is:

1. A light-emitting device comprising:
   a first base material including a first conductor pattern formed from a resin having flexibility and provided on the front surface, and a first connection pad electrically connected to the first conductor pattern;
   a light-emitting member including a first conductor member connected to the first connection pad by protruding toward the first connection pad, a first electrode electrically connected to the first conductor member, and a first semiconductor layer connected to the first electrode;
   a second base material holding the light-emitting member; and
   an intermediate layer retaining the first base material and the second base material,
   wherein a radius of a circle contacting the first connection pad at at least three points on the outer edge of a contact area of the first connection pad contacting the first conductor member, the radius of the circle defining the curvature of the first base material curved on the outer edge of the contact area, is 13 μm or larger.

2. The light-emitting device according to claim 1, wherein the first base material is at least one material selected from the group consisting of polyethylene terephthalate (PET), polyethylene naphthalate (PEN), a polycarbonate (PC), polyethylene succinate (PES), a cyclic olefin resin, and an acrylic resin, the first base material has a flexural modulus of 0 to 320 kgf/mm$^2$, and
   the first conductor member includes a metal material and has a dynamic hardness value DHV of 3 to 150.

3. The light-emitting device according to claim 1, wherein an amount of bite of the first conductor member into the first connection pad and the first base material at the contact area is 15 μm.

4. The light-emitting device according to claim 3, wherein the first conductor member has a height of 10 to 60 μm.

5. The light-emitting device according to claim 1, wherein the height (T1) of the light-emitting member is higher than the thickness (T2) of the intermediate layer, and the first base material has a curved shape such that the site of disposition of the light-emitting member protrudes outward, and the circumference of the light-emitting member is depressed inward.

6. The light-emitting device according to claim 1, wherein the first base material has a second conductor pattern electrically connected to a second connection pad,
   the light-emitting member includes a second conductor member connected to the second connection pad by protruding toward the second connection pad, a second electrode electrically connected to the second conductor member, and a second semiconductor layer connected to the second electrode, and
   the second electrode is disposed on the same surface of the light-emitting member as the surface provided with the first electrode.

7. The light-emitting device according to claim 1, wherein the radius of the circle is 20 μm or larger.

8. The light-emitting device according to claim 1, wherein the radius of the circle is 25 μm or larger.

* * * * *